US011011465B2

(12) United States Patent
Takemori et al.

(10) Patent No.: US 11,011,465 B2
(45) Date of Patent: May 18, 2021

(54) SINGLE CRYSTAL SILICON CARBIDE SUBSTRATE, METHOD OF MANUFACTURING SINGLE CRYSTAL SILICON CARBIDE SUBSTRATE, AND SEMICONDUCTOR LASER

(71) Applicant: Hitachi Power Solutions Co., Ltd., Hitachi (JP)

(72) Inventors: Hideaki Takemori, Hitachi (JP); Hisashi Aoki, Hitachi (JP); Toru Itagaki, Hitachi (JP)

(73) Assignee: Hitachi Power Solutions Co., Ltd., Hitachi (JP)

( * ) Notice: Subject to any disclaimer, the term of this patent is extended or adjusted under 35 U.S.C. 154(b) by 6 days.

(21) Appl. No.: 16/527,316

(22) Filed: Jul. 31, 2019

(65) Prior Publication Data
US 2020/0043844 A1     Feb. 6, 2020

(30) Foreign Application Priority Data

Aug. 3, 2018   (JP) .............................. JP2018-146437

(51) Int. Cl.
*H01L 23/528* (2006.01)
*H01L 29/16* (2006.01)
(Continued)

(52) U.S. Cl.
CPC ...... *H01L 23/528* (2013.01); *H01L 21/32135* (2013.01); *H01L 21/32139* (2013.01);
(Continued)

(58) Field of Classification Search
CPC ............. H01L 23/528; H01L 21/32135; H01L 21/32139; H01L 21/76838; H01L 29/1608; H01S 5/0206
See application file for complete search history.

(56) References Cited

U.S. PATENT DOCUMENTS

2014/0194719 A1 * 7/2014 Frewin ............... A61B 5/04001
                                                         600/377
2014/0321491 A1   10/2014 Sakata et al.
(Continued)

FOREIGN PATENT DOCUMENTS

JP       2008-290888 A    12/2008
JP       2014/225660 A    12/2014
WO   WO 2017/098689 A1     6/2017

OTHER PUBLICATIONS

Taiwanese-language Office Action issued in Taiwanese Application No. 108127240 dated May 29, 2020 with English translation (eight (8) pages).

*Primary Examiner* — Lex H Malsawma
(74) *Attorney, Agent, or Firm* — Crowell & Moring LLP

(57) ABSTRACT

A single crystal silicon carbide substrate includes a substrate of a single crystal silicon carbide; a first wiring film and a second wiring film disposed on one side of the substrate and having therebetween an interstice which is formed continuously without being broken from a first end of the one side to a second end of the one side; and an insulating portion disposed in the interstice between the first wiring film and the second wiring film and including a surface texture of the one side exposed by removing using dry etching a surface contaminated layer which is contaminated by at least one of iron, aluminum, chromium, or nickel adhered thereto.

7 Claims, 16 Drawing Sheets

(51) Int. Cl.
*H01S 5/02* (2006.01)
*H01L 21/3213* (2006.01)
*H01L 21/768* (2006.01)

(52) U.S. Cl.
CPC .... *H01L 21/76838* (2013.01); *H01L 29/1608* (2013.01); *H01S 5/0206* (2013.01)

(56) References Cited

U.S. PATENT DOCUMENTS

2016/0181760 A1 6/2016 Sakata et al.
2018/0269650 A1* 9/2018 Nozaki ............... H01S 5/02469

* cited by examiner

FIG. 19A
FIG. 19B
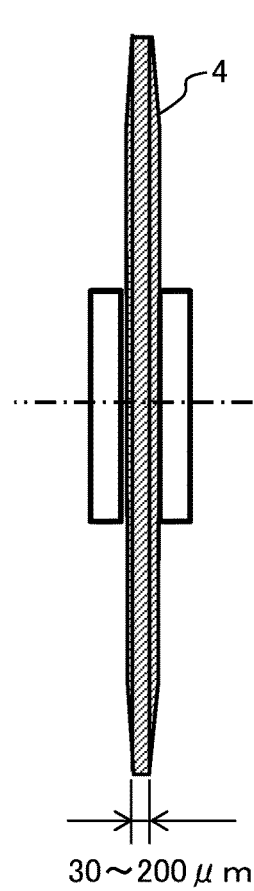
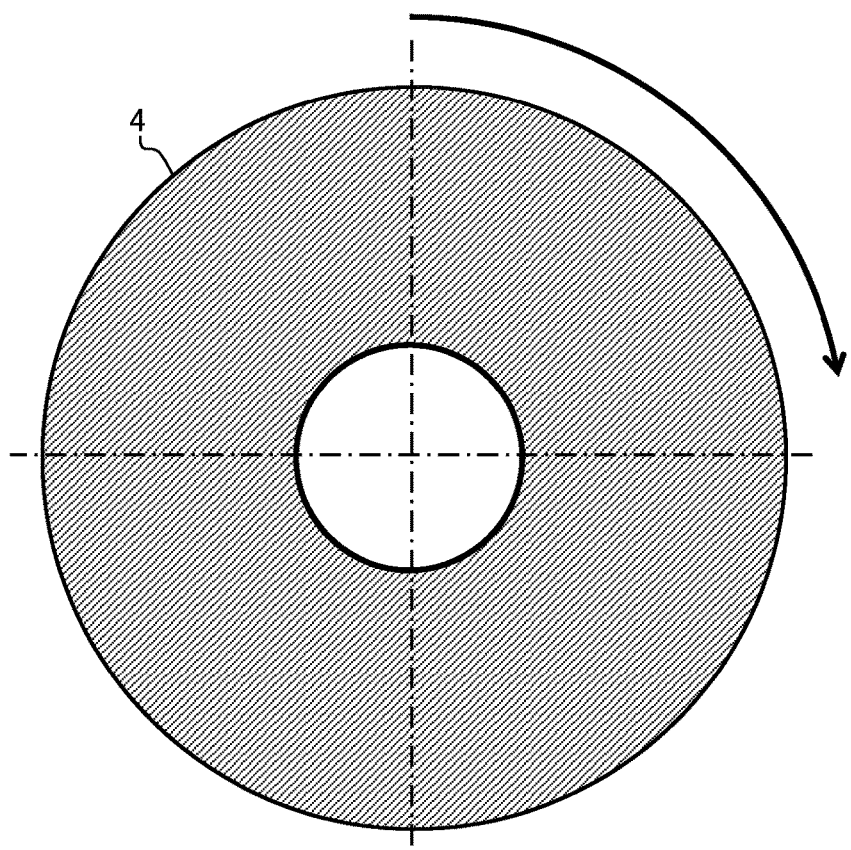
30~200 μm

SINGLE CRYSTAL SILICON CARBIDE SUBSTRATE, METHOD OF MANUFACTURING SINGLE CRYSTAL SILICON CARBIDE SUBSTRATE, AND SEMICONDUCTOR LASER

CROSS-REFERENCE TO RELATED APPLICATIONS

This application is based upon and claims the benefit of priority from Japanese Patent Applications No. 2018-146437 filed on Aug. 3, 2018; the entire contents of which are incorporated herein by reference.

BACKGROUND OF THE INVENTION

The present invention relates to a single crystal silicon carbide substrate, a method for manufacturing the single crystal silicon carbide substrate, and a semiconductor laser.

In recent years, there is an extremely strong demand for high speed, miniaturization and light weight (high density), high output, and high reliability of electronic equipment. A semiconductor element rapidly advances toward a direction of high integration, large size, multi-chip, and high output. An electronic circuit advances toward a direction of miniaturization, reduced length of wiring, and low resistance. Among such advancement, an important issue is how to efficiently remove (heat dissipation) heat generated by the element.

In addition to heat generation, there are also problems such as a dielectric breakdown of a substrate caused by an increased wiring density or high power in the electronic circuit. A material for the substrate is required to be good in thermal conductivity, excellent in electrical insulation property, good in high frequency characteristic, close to Si or GaAs in thermal expansion coefficient, stable in chemical property, high in mechanical strength, easy in circuit formation, and airtight sealable. In addition, from the aspect of manufacture, it is required to be inexpensive, high in technical completeness, easy to obtain a raw material, applicable to a simple and inexpensive manufacturing process, and contain no toxic substance such as pollutants.

Polycrystalline alumina (thermal conductivity: about 23 W/m·K), polycrystalline aluminum nitride (thermal conductivity: about 170 W/m·K), polycrystalline silicon carbide (thermal conductivity: about 300 W/m·K) and the like are generally used as a ceramic substrate material.

However, in recent years, a semiconductor laser having an insufficient heat dissipation characteristic is increasing even when polycrystalline silicon carbide with a thermal conductivity of 300 W/m·K is used as the substrate material. Therefore, single crystal silicon carbide with a thermal conductivity of about 490 W/m·K is mainly used as the substrate material.

PTL 1 (JP-A-2008-290888) discloses an invention relating to a surface treatment method of silicon carbide capable of micro-processing a surface of the silicon carbide to any shape and in high definition, and particularly capable of micro-processing the surface of the silicon carbide by a dimensional tolerance of a nanometer level when the surface of the silicon carbide is micro-processed by reactive ion etching.

SUMMARY OF THE INVENTION

However, a problem which does not occur in a polycrystalline substrate occurs in usage of a single crystal silicon carbide substrate during the advancement of high output of the semiconductor laser, high integration of the semiconductor element, and miniaturization of the electronic circuit. The problem is that an insulation characteristic of the substrate is lowered in a manufacturing process of the substrate. PTL 1 does not disclose such a problem or a solution to such a problem.

Considering the above problem, the inventors first use two methods which are Auger Electron Spectroscopy (AES) and Time-of-Flight Secondary Ion Mass Spectrometry (TOF-SIMS) to examine the surfaces of the polycrystalline silicon carbide substrate and the single crystal silicon carbide substrate using dry etching in the manufacturing process. Compared with the AES, the substrate surface can be more accurately examined in detail using the TOF-SIMS.

<Verification Result 1>

As a result of the examination, iron, chromium, nickel, and aluminum which are elements that have a negative influence on the insulation characteristic of the substrate are adhered to the surface of the single crystal silicon carbide substrate to form a surface contaminated layer. These elements are considered as elements that form a substrate manufacturing device. It should be noted that iron, chromium, and nickel are components of a chamber, and aluminum is a component of a jig. None of the elements which are confirmed to be adhered to the single crystal silicon carbide substrate is confirmed on the surface of the polycrystalline silicon carbide substrate. The surface contaminated layer is not confirmed by the AES and is confirmed by the TOF-SIMS by which an analysis can be performed in more detail.

<Verification Result 2>

Next, the inventors perform an examination from an aspect of the manufacturing process. A surface of a single crystal silicon carbide substrate in which a wiring film is formed using a metal mask and a surface of a single crystal silicon carbide substrate in which a wiring film is formed using dry etching are examined by the TOF-SIMS.

In the manufacturing method using the metal mask, no element which has a negative influence on the insulation characteristic is confirmed to be adhered to the substrate surface. However, since dimensional accuracy and positional accuracy of the wiring film is poor in the manufacturing method using the metal mask, the manufacturing method using the metal mask cannot be used in a substrate of the semiconductor laser. Although dimensional accuracy and positional accuracy of the wiring film is good in the manufacturing method using dry etching, it is confirmed that elements which have a negative influence on the insulation characteristic are adhered to the substrate surface and a surface contaminated layer is formed.

According to the above verification results 1 and 2, it is found that the elements that have a negative influence on the insulation characteristic of the substrate are adhered to the surface of the substrate and the surface contaminated layer is formed when dry etching is used in the manufacturing process of the single crystal silicon carbide substrate.

Therefore, an object of the invention is to ensure the insulation characteristic of the substrate when dry etching is used in the manufacturing process of the single crystal silicon carbide substrate.

From an aspect of the invention, a single crystal silicon carbide substrate includes a substrate of a single crystal silicon carbide; a first wiring film and a second wiring film disposed on one side of the substrate and having therebetween an interstice which is formed continuously without being broken from a first end of the one side to a second end of the one side; and an insulating portion disposed in the interstice between the first wiring film and the second wiring film and including a surface texture of the one side exposed by removing using dry etching a surface contaminated layer which is contaminated by at least one of iron, aluminum, chromium, or nickel adhered thereto.

Other means will be described in description of embodiments.

According to the invention, an insulation characteristic of the substrate can be ensured when dry etching is used in the manufacturing process of the single crystal silicon carbide substrate.

BRIEF DESCRIPTION OF DRAWINGS

FIGS. 19A and 19B are respectively a side view and a plan view which show an example of a shape of the dicing blade;

DESCRIPTION OF EMBODIMENTS

Hereinafter, embodiments of the invention will be described in detail with reference to the drawings.

FIGS. 1 to 6 are views showing a method of manufacturing a single crystal silicon carbide substrate 13f.

Figure 1:
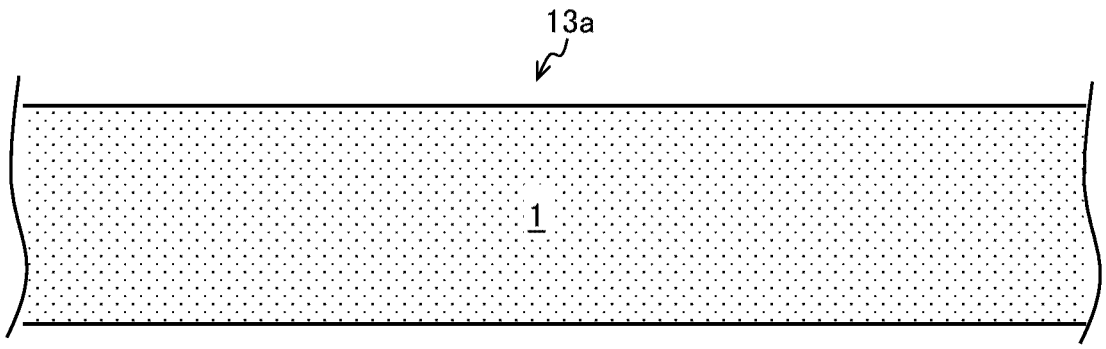
FIG. 1 is a side view of a single crystal silicon carbide substrate before first processing.

FIG. 1 is a side view of a single crystal silicon carbide substrate 13a before first processing.

The substrate 13a is originally constituted by a single crystal silicon carbide substrate 1 having a flat plate shape. Silicon carbide (SiC) is an artificial compound which does not exist in nature and is synthesized from silica sand and carbon. Silicon carbide maintains strength thereof up to high temperature (1500° C.), is light in weight and high in corrosion resistance, and is preferably used as a heat resistant material. The substrate 13f shown in FIG. 6 can be obtained by performing first processing on the single crystal silicon carbide substrate 1. The first processing will be described below.

Figure 2:
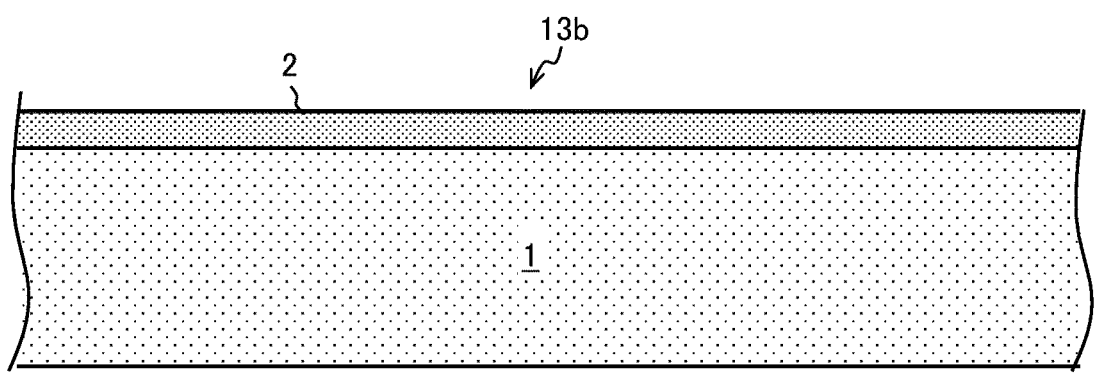
FIG. 2 is a side view of a substrate with a wiring film formed.

FIG. 2 is a side view of a substrate 13b with a wiring film 2 formed.

On the substrate 13b, the wiring film 2 is formed on an entire surface of one surface of the single crystal silicon carbide substrate 1 by sputtering, vapor deposition, or the like.

Figure 3:
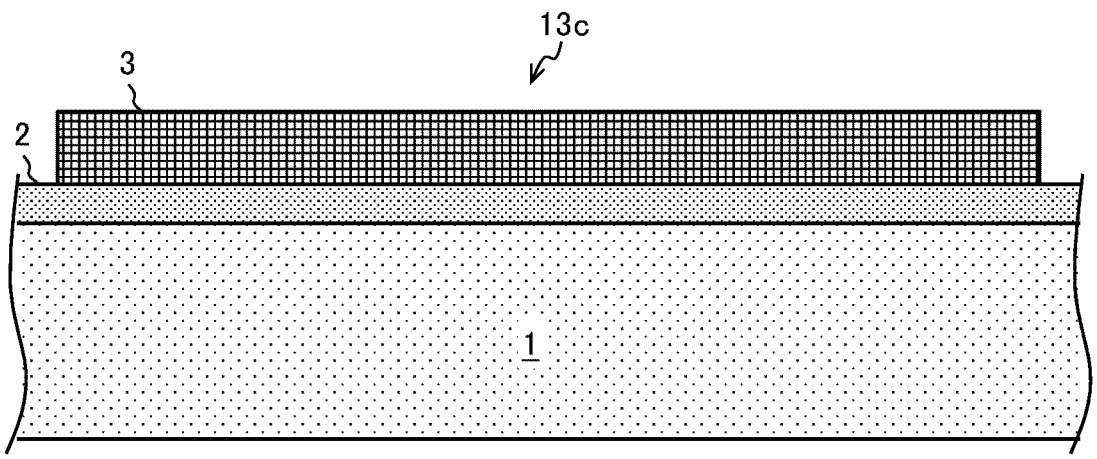
FIG. 3 is a side view of a substrate subjected to patterning of a photoresist.

FIG. 3 is a side view of a substrate 13c subject to patterning of a photoresist layer 3.

Photolithography is a technique in which a surface of a substance coated with a photosensitive substance is exposed in a pattern (also referred to as pattern exposure, imagewise exposure, or the like) to generate a pattern including an exposed portion and an unexposed portion. Photolithography technique is mainly used to manufacture a semiconductor element, a printed circuit board, a liquid crystal display, a plasma display panel, and the like. The photoresist layer 3 is a composition which is used in photolithography and in which a physical property such as solubility is changed by light, an electron beam or the like. A phenomenon in which photoresist is selectively dissolved is referred to as development. A name of resist is given since the resist is coated on the surface of the substance to protect a surface of the substance from processing such as etching.

After the photoresist which is a photosensitive substance is coated (not shown) at a surface side of the substrate 13b shown in FIG. 2, when a portion of the wiring film 2 to be uncovered is exposed, the photoresist reacts, and as shown in FIG. 3, a circuit pattern is printed as the photoresist layer 3 by subsequent development.

Figure 4:
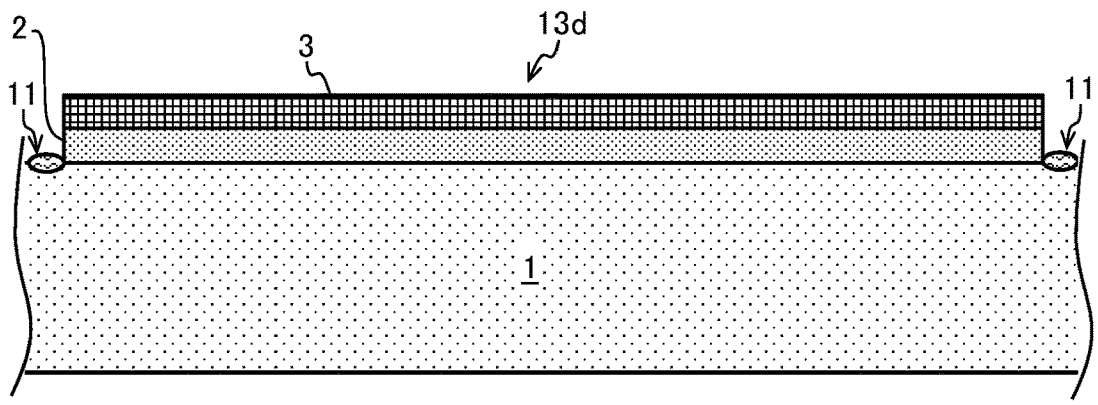
FIG. 4 is a side view of a substrate from which a wiring film at a position without a photoresist layer is removed by dry etching.

FIG. 4 is a side view of a substrate 13d from which the wiring film 2 at a position without the photoresist layer 3 is removed by dry etching.

Dry etching is a method of etching a material with reactive gas (etching gas such as argon), an ion or a radical. Dry etching is a main force in a semiconductor industry. Other types of etching include etching with liquid (wet etching) and physical etching without a chemical reaction. Etching is performed on a portion where the wiring film 2 at the position without the photoresist layer as shown in FIG. 3 is uncovered. Therefore, a substrate surface 11 of the substrate 13d is exposed on a portion where the wiring film 2 is uncovered.

In this example, the substrate surface 11 is a portion where the surface of the single crystal silicon carbide substrate 1 is exposed continuously without being broken around the wiring film 2. The substrate surface 11 is contaminated by iron, aluminum, chromium, nickel, and the like adhered thereto by a dry etching process.

Figure 5:
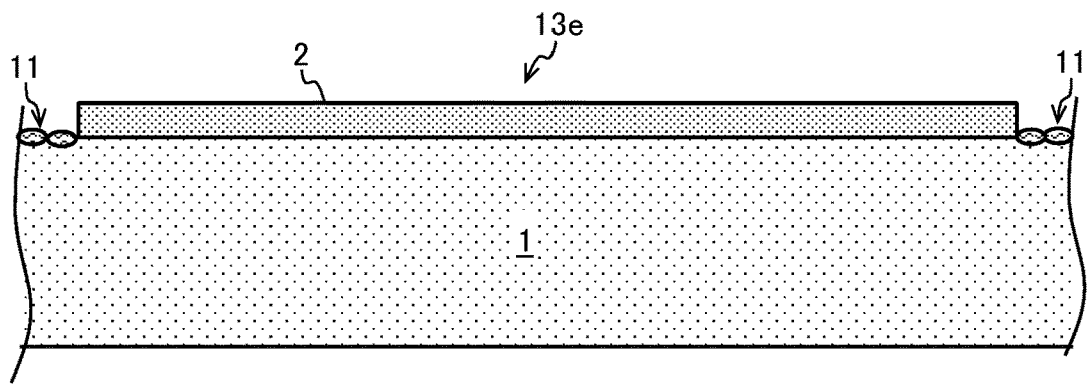
FIG. 5 is a side view of a substrate from which the photoresist layer is peeled off (removed)

FIG. 5 is a side view of a substrate 13e from which the photoresist layer 3 is peeled off (removed).

The substrate 13e shown in FIG. 5 can be obtained by peeling off (removing) the entire photoresist layer 3 with chemicals or the like from the substrate 13d shown in FIG. 4. On the substrate 13e, the wiring film 2 is formed on one surface of the single crystal silicon carbide substrate 1, and the wiring film 2 is formed in a desired pattern in a micro-order by the photolithography technique.

Figure 6:
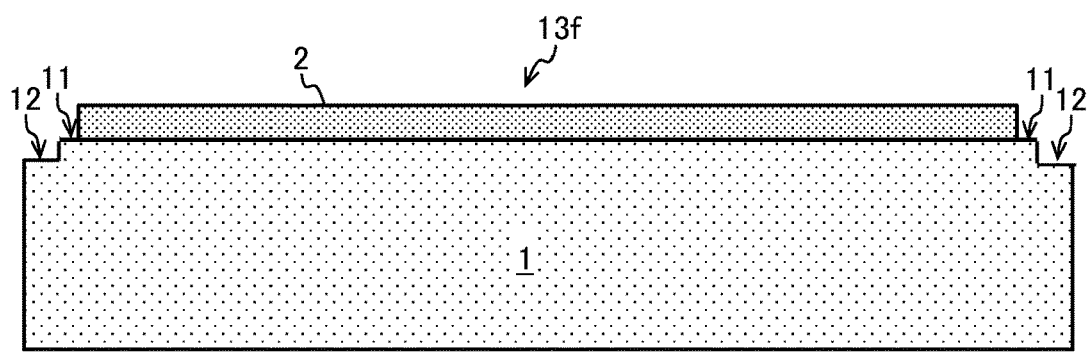
FIG. 6 is a side view showing a substrate on which an insulating portion that exposes surface texture of the substrate is formed by performing grooving processing on a surface of the single crystal silicon carbide substrate.

FIG. 6 is a side view showing a substrate 13f on which an insulating portion 12 that exposes surface texture of the substrate is formed by performing grooving processing on the surface of the single crystal silicon carbide substrate 1.

The substrate 13f shown in FIG. 6 is individually divided. The substrate surface 11 of the single crystal silicon carbide substrate 1 is continuously exposed without being broken around the wiring film 2. The insulating portion 12 which exposes texture of the surface of the single crystal silicon carbide substrate is formed continuously without being broken around the exposed substrate surface 11. That is, a part of the substrate surface 11 in FIG. 5 is dug to be lowered by grooving processing. Since the insulating portion 12 is formed in this manner, the insulation characteristic between the wiring film 2 of the substrate 13f and external ground or the like is ensured.

According to an analysis result of Dynamic Secondary Ion Mass Spectrometry (Dynamic-SIMS), a depth direction penetration amount of iron, aluminum, chromium, and nickel which are adhered to the single crystal silicon carbide substrate 1 by the dry etching process is 0.1 μm or less. Therefore, although a processing amount of the grooving processing on the single crystal silicon carbide is sufficiently up to 1 μm in a depth direction, in practice, the processing amount is about 30 μm considering processability. A method of removing the surface contaminated layer may be any processing method as long as it is laser processing or machining. There is a degree of freedom for a processing method and a processing shape. The processing method includes, for example, grooving processing, laser processing, blasting processing by a blade. The processing shape may be any shape such as a straight line, a bend line, a curved line.

FIGS. 7 to 12 are views showing a method of manufacturing a single crystal silicon carbide substrate 14f.

Figure 7:
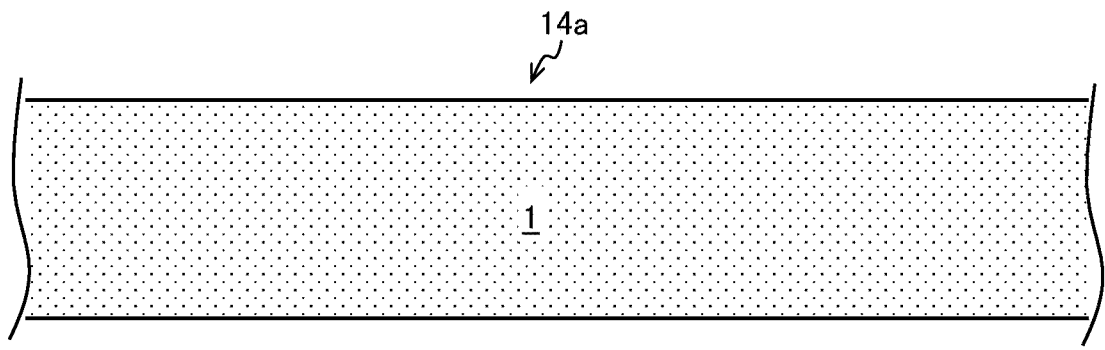
FIG. 7 is a side view of a single crystal silicon carbide substrate before second processing.

FIG. 7 is a side view of a single crystal silicon carbide substrate 14a before second processing.

The substrate 14a is originally constituted by the single crystal silicon carbide substrate 1 having a flat plate shape. The substrate 14f shown in FIG. 12 can be obtained by performing the second processing on the single crystal silicon carbide substrate 1. The second processing will be described below.

Figure 8:
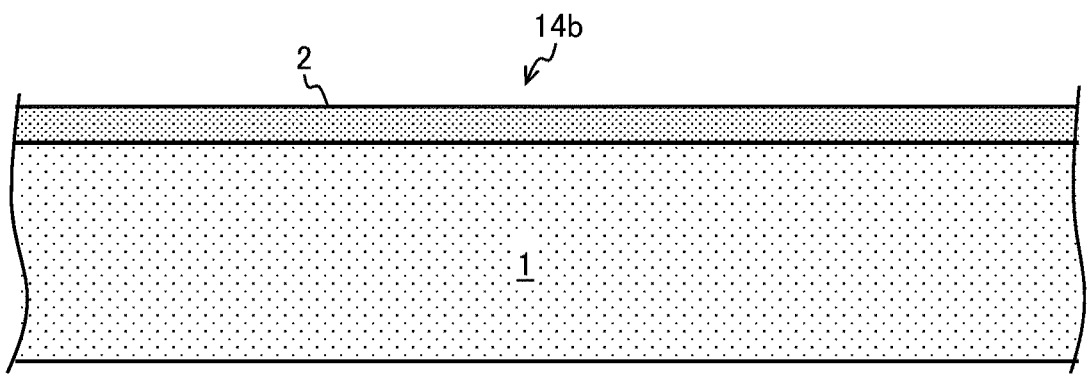
FIG. 8 is a side view of a substrate with a wiring film formed.

FIG. 8 is a side view of a substrate 14b with the wiring film 2 formed.

On the substrate 14b, the wiring film 2 is formed on one surface of the single crystal silicon carbide substrate 1.

Figure 9:
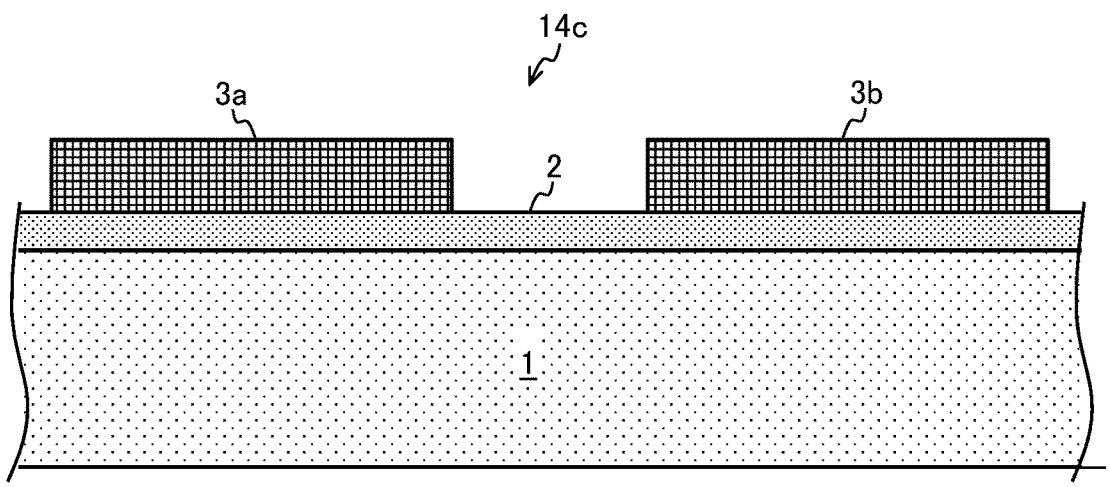
FIG. 9 is a side view of a substrate subjected to patterning of a photoresist.

FIG. 9 is a side view of a substrate 14c subject to patterning of the photoresist layer 3.

After the photoresist which is a photosensitive substance is coated at a surface side of the substrate 14b shown in FIG. 8, when a portion of the wiring film 2 to be uncovered is exposed, the photoresist reacts, and a circuit pattern which includes photoresist layers 3a, 3b is printed by subsequent development.

Figure 10:
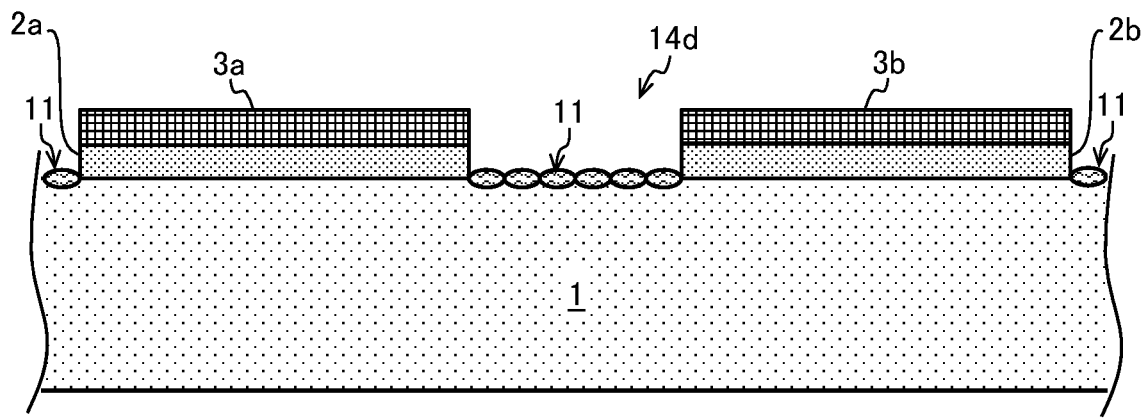
FIG. 10 is a side view of a substrate from which a wiring film at a position without a photoresist layer is removed by dry etching.

FIG. 10 is a side view of the substrate 14d from which the wiring film 2 at a position without the photoresist layers 3a, 3b is removed by dry etching.

Etching is performed on a portion where the wiring film 2 at the position without the photoresist layer as shown in FIG. 9 is uncovered. Therefore, the substrate surface 11 of the substrate 14d is exposed on a portion where the wiring film 2 is uncovered. The substrate surface 11 is exposed to separate the wiring film to wiring films 2a, 2b.

The substrate surface 11 is a portion where the surface of the single crystal silicon carbide substrate 1 is exposed continuously without being broken around the wiring films 2a, 2b. The substrate surface 11 is contaminated by iron, aluminum, chromium, nickel, and the like adhered thereto by a dry etching process.

Figure 11:
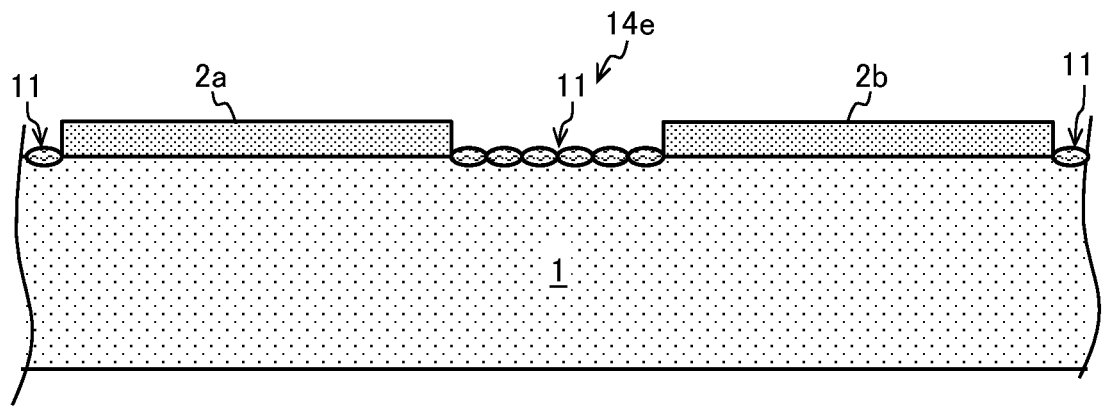
FIG. 11 is a side view of a substrate from which the photoresist layer is peeled off (removed)

FIG. 11 is a side view of a substrate 14e from which the photoresist layers 3a, 3b are peeled off (removed).

The substrate 14e shown in FIG. 11 can be obtained by peeling off (removing) the entire photoresist layers 3a, 3b with chemicals or the like from the substrate 14d shown in FIG. 10. On the substrate 14e, the wiring films 2a, 2b are formed on one surface of the single crystal silicon carbide substrate 1, and the wiring films 2a, 2b are formed in a desired pattern by the photolithography technique.

Figure 12:
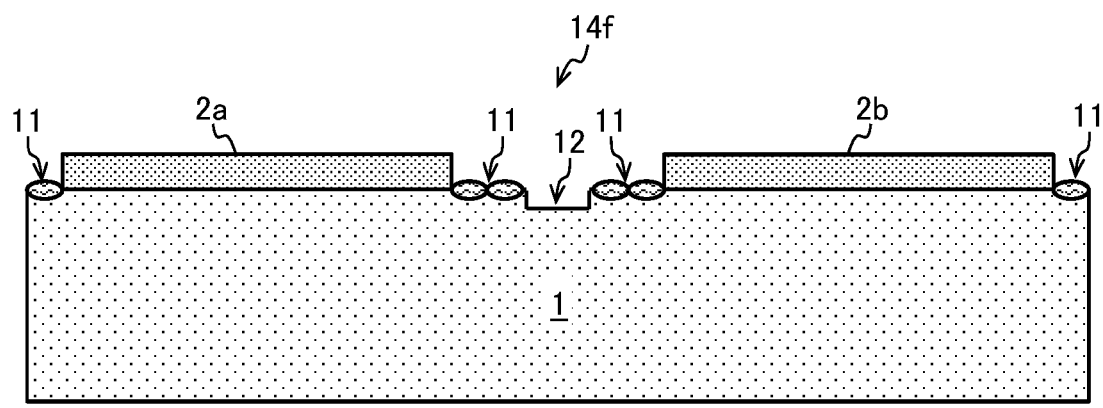
FIG. 12 is a side view showing a state in which an insulating portion that exposes surface texture of the substrate is formed by performing grooving processing on a surface of the single crystal silicon carbide substrate.

FIG. 12 is a side view showing a substrate 14f on which the insulating portion 12 that exposes surface texture of the substrate is formed by performing grooving processing on the surface of the single crystal silicon carbide substrate 1.

The substrate 14f shown in FIG. 12 is individually divided. Between the wiring films 2a, 2b, the surface of the single crystal silicon carbide substrate 1 is continuously exposed without being broken from a first end portion to a second end portion of the substrate 14f. Further, on the exposed surface, the insulating portion 12 that exposes surface texture of the single crystal silicon carbide is formed continuously without being broken from the first end portion to the second end portion. The insulating portion 12 is a portion where a groove of about 30 μm in the depth direction with respect to the substrate surface 11 is formed by machining or laser processing.

The first end portion is referred to as an end portion that is present on any side among four sides of the substrate. The second end portion is referred to as an end portion that is present on the other side that does not include the first end portion.

When four sides of the substrate are defined as a first to a fourth side, any one of the four sides which are an upper side, a right side, a lower side, and a left side of the substrate can be selected as the first side. Three possible side combinations that include the first end portion and the second end portion are the first side and the second side, the first side and the third side, and the first side and the fourth side. There are 12 combinations in total and any one of the combinations can be selected.

The insulating portion 12 is continuous so as to cut wiring films 2a, 2b. Since the surface contaminated layer is removed, the insulating portion 12 ensures the insulation characteristic between the wiring film 2a and the wiring film 2b of the substrate 14f.

The substrate surface 11 of the single crystal silicon carbide substrate 1 is continuously exposed without being broken around the wiring films 2a, 2b.

Specifically, the inventors make an inter-wiring gap of 150 μm formed on the wiring film 2 formed with Ti (0.1 μm), Pt (0.2 μm), and Au (5 μm), respectively, after dry etching is performed. Further, grooving processing is performed on the inter-wiring gap of the substrate by a blade having a width of 30 μm and a depth of 30 μm. Then, a resistance value between wiring before surface processing is $10^9$ to $10^{10}\Omega$ while a resistance value between wiring after the surface processing is improved to $10^{11}\Omega$. Thus, the insulation characteristic between the wiring films 2a, 2b is ensured by forming the insulating portion 12.

Substrates shown in the following FIGS. 13A to 18B and FIGS. 20A to 21C are subjected to dry etching to perform patterning of the wiring film. Accordingly, the wiring film can be disposed on the substrate with high accuracy.

Figure 13A:
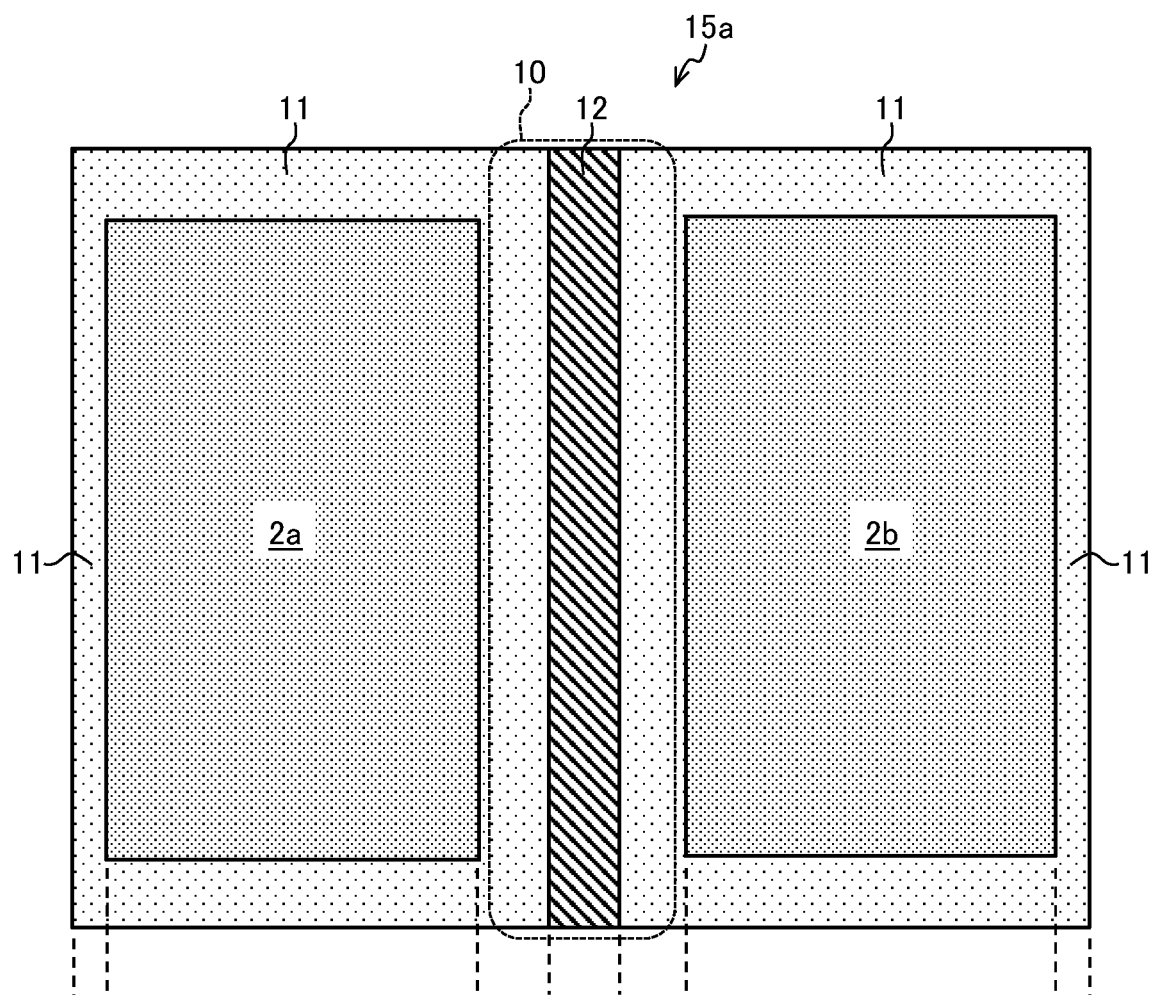
FIGS. 13A and 13B are respectively a plan view and a side view which show an example in which slit processing is performed between a first wiring film and a second wiring film by a dicing blade.
Figure 13B:
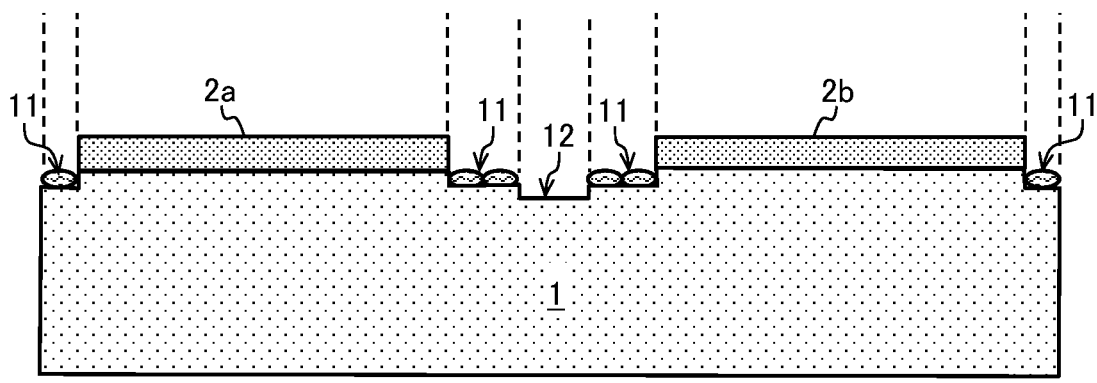

FIGS. 13A and 13B are respectively a plan view and a side view showing an example in which slit processing is performed by a dicing blade 4 (see FIGS. 19A and 19B) between the first wiring film 2a and the second wiring film 2b. Each of FIGS. 13A to 17B shows a plan view or a side view at the same time.

On a substrate 15a, the rectangular wiring film 2a (first wiring film) and the rectangular wiring film 2b (second wiring film) are formed on the surface side of the single crystal silicon carbide substrate 1. Between the wiring films 2a, 2b, a gap is formed in a longitudinal direction to include an opposite portion between the wiring films 2a, 2b, and the substrate surface 11 is exposed. The gap 10 (first gap) is formed continuously without being broken between the wiring films 2a, 2b from an upper end (first end portion) to a lower end (second end portion) of the surface of the substrate 15a. The substrate surface 11 is exposed at a predetermined width on each side other than the opposite portion between the wiring films 2a, 2b.

In the gap 10, the insulating portion 12 that exposes surface texture of the single crystal silicon carbide substrate 1 is formed in a linear shape to include the opposite portion between the wiring films 2a, 2b. The insulating portion 12 (first end portion) is a portion that, on the substrate surface 11, exposes surface texture of the single crystal silicon carbide substrate 1 and is formed continuously without being broken from the upper end (first end portion) to the lower end (second end portion) of the surface of the substrate 15a.

The insulating portion 12 is mechanically formed by processing with the dicing blade 4 (see FIGS. 19A and 19B) to be described later. A groove having a width of about 30 μm and a depth of about 30 μm with respect to the substrate surface 11 is formed on the insulating portion 12. Accordingly, the surface contaminated layer formed on the substrate surface 11 can be removed, and the insulation characteristic between the wiring films 2a, 2b can be ensured.

Figure 14A:
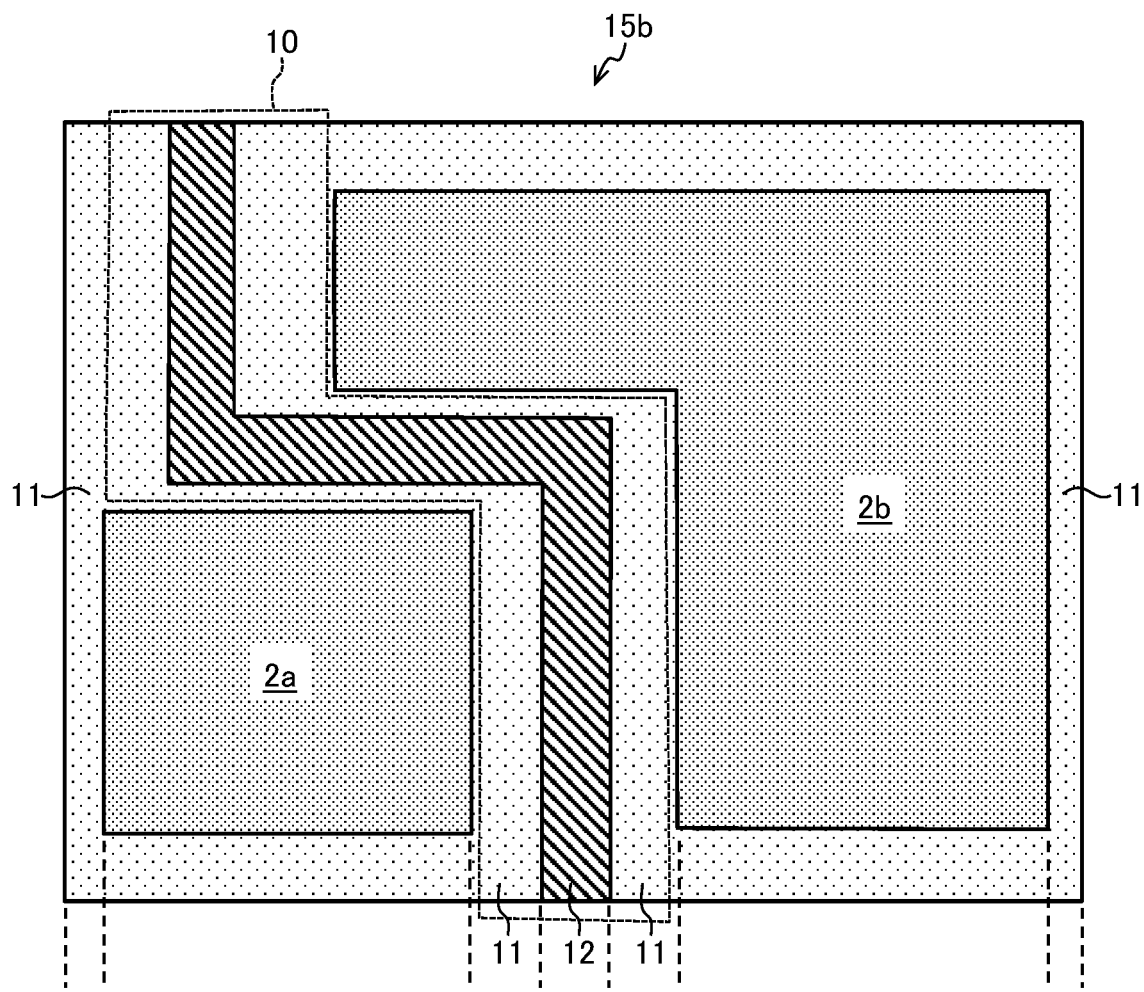
FIGS. 14A and 14B are respectively a plan view and a side view which show an example in which laser processing or blasting processing is performed between the first wiring film and the second wiring film.
Figure 14B:
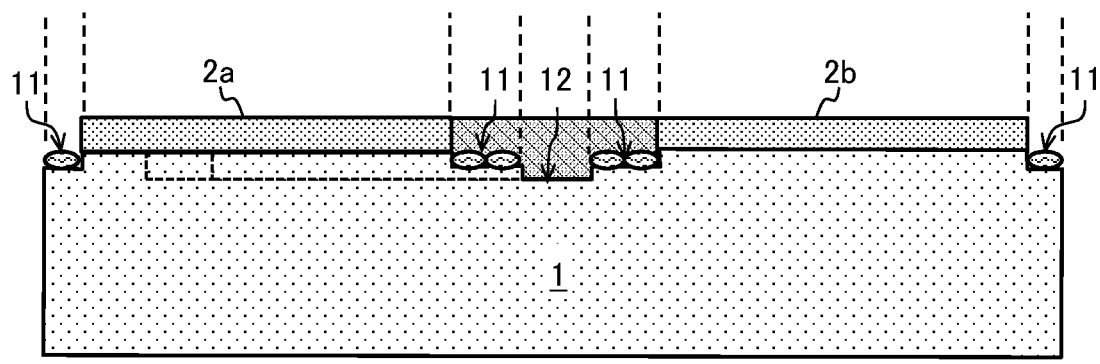

FIGS. 14A and 14B are respectively a plan view and a side view showing an example in which laser processing or blasting processing is performed between the first wiring film 2a and the second wiring film 2b.

On a substrate 15b, the rectangular wiring film 2a (first wiring film) and the L-shaped wiring film 2b (second wiring film) are formed on the surface side of the single crystal silicon carbide substrate 1. Between the wiring films 2a, 2b, a crank-shaped gap 10 is formed to include the opposite portion of the wiring films 2a, 2b, and the substrate surface 11 is exposed. The gap 10 (first gap) is formed continuously without being broken between the wiring films 2a, 2b from the upper end (first end portion) to the lower end (second end portion) of the surface of the substrate 15b. The substrate surface 11 is exposed at a predetermined width on each side other than the opposite portion between the wiring films 2a, 2b.

In the gap 10, the insulating portion 12 that exposes surface texture of the single crystal silicon carbide substrate 1 includes the opposite portion between the wiring films 2a, 2b, and is formed in a crank shape longer than the opposite portion. The insulating portion 12 (first end portion) is a portion that, on the substrate surface 11, exposes surface texture of the single crystal silicon carbide substrate 1 and is formed continuously without being broken from the upper end (first end portion) to the lower end (second end portion) of the surface of the substrate 15a. The insulating portion 12 is mechanically formed by laser processing or blasting processing. A groove of about 30 μm in the depth direction with respect to the substrate surface 11 is formed on the insulating portion 12.

Accordingly, the surface contaminated layer formed on the substrate surface 11 can be removed, and the insulation characteristic between the wiring films 2a, 2b can be ensured.

Figure 15A:
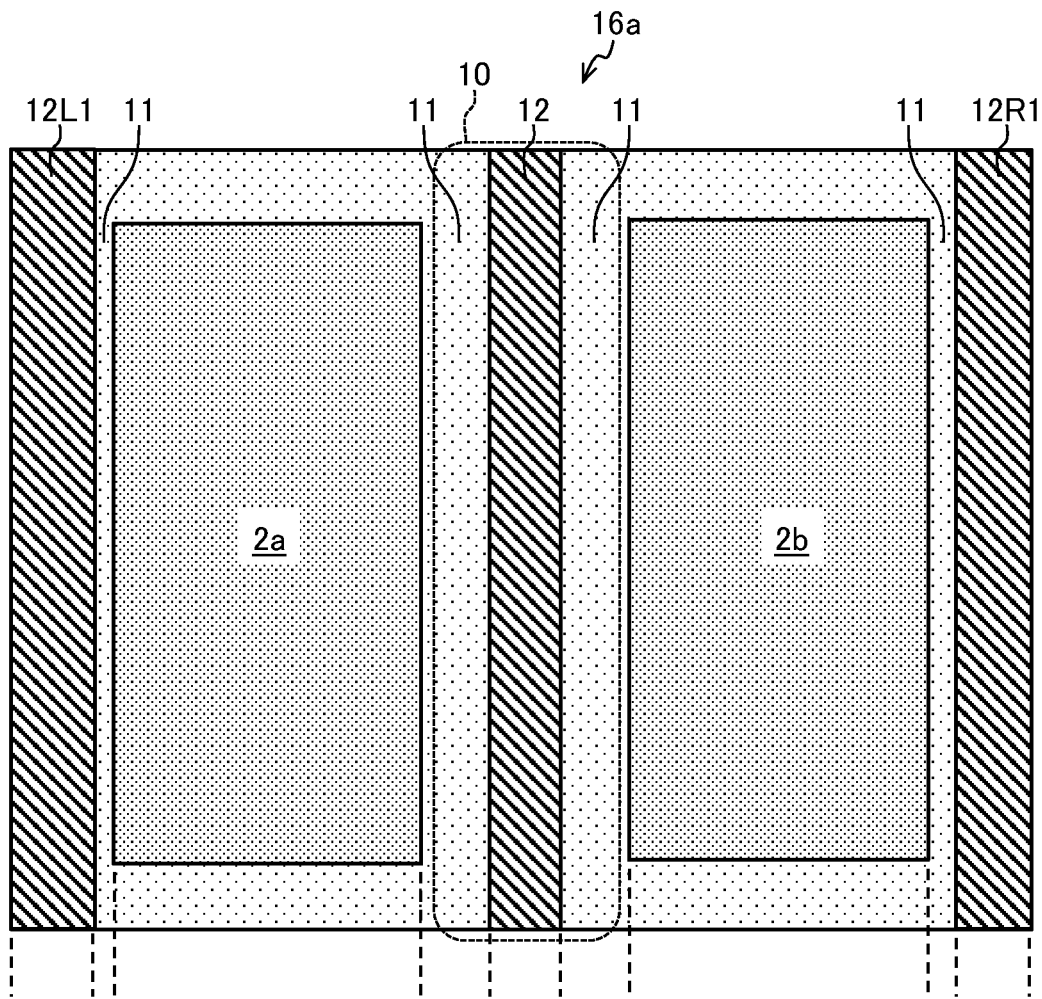
FIGS. 15A and 15B are respectively a plan view and a side view which show an example in which slit processing is performed between wiring and around wiring films by the dicing blade.
Figure 15B:
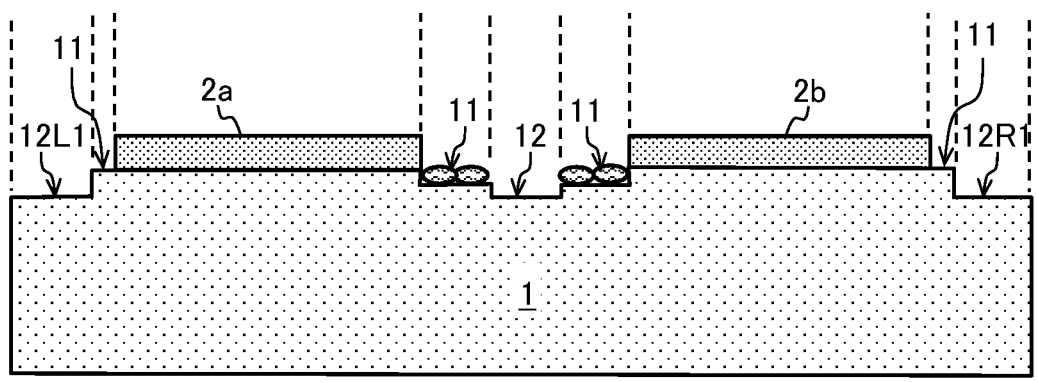

FIGS. 15A and 15B are respectively a plan view and a side view which show an example in which slit processing is performed between the wiring and around the wiring films 2a, 2b by the dicing blade 4 (see FIGS. 19A and 19B).

On a substrate 16a, the rectangular wiring film 2a (first wiring film) and the rectangular wiring film 2b (second wiring film) are formed on the surface side of the single crystal silicon carbide substrate 1. Between the wiring films 2a, 2b, the gap 10 is formed in a longitudinal direction to include the opposite portion between the wiring films 2a, 2b, and the substrate surface 11 is exposed. The gap 10 (first gap) is formed continuously without being broken between the wiring films 2a, 2b from the upper end (first end portion) to the lower end (second end portion) of the surface of the substrate 16a. The substrate surface 11 is exposed at a predetermined width on each side other than the opposite portion between the wiring films 2a, 2b.

In the gap 10, the insulating portion 12 that exposes surface texture of the single crystal silicon carbide substrate 1 is formed in a linear shape to include the opposite portion between the wiring films 2a, 2b. The insulating portion 12 (first insulating portion) is a portion that, on the substrate surface 11, exposes surface texture of the single crystal silicon carbide substrate 1 and is formed continuously without being broken from the upper end (first end portion) to the lower end (second end portion) of the surface of the substrate 16a. Accordingly, the surface contaminated layer formed on the substrate surface 11 can be removed, and the insulation characteristic between the wiring films 2a, 2b can be ensured.

Further, an insulating portion 12L1 (a second insulating portion) that exposes surface texture of the single crystal silicon carbide substrate 1 is formed in a linear shape on a left side of the substrate surface 11 on a left side of the wiring film 2a. An insulating portion 12R1 (a second insulating portion) that exposes surface texture of the single crystal silicon carbide substrate 1 is formed in a linear shape on a right side of the substrate surface 11 on a right side of the wiring film 2a. The insulating portions 12L1, 12R1 are mechanically formed by processing with the dicing blade 4 (see FIGS. 19A and 19B) to be described later, and are formed continuously without being broken from the upper end (first end portion) to the lower end (second end portion) of the substrate 16a. Grooves of about 30 μm in the depth direction with respect to the substrate surface 11 are formed on the insulating portions 12L1, 12R1.

The insulating portion 12L1 can ensure the insulation characteristic between the wiring film 2a and the ground or the like even when the left side of the substrate 16a is in contact with the ground or the like. Further, the insulating portion 12R1 can ensure the insulation characteristic between the wiring film 2b and the ground or the like even when the right side of the substrate 16a is in contact with the ground or the like.

Figure 16A:
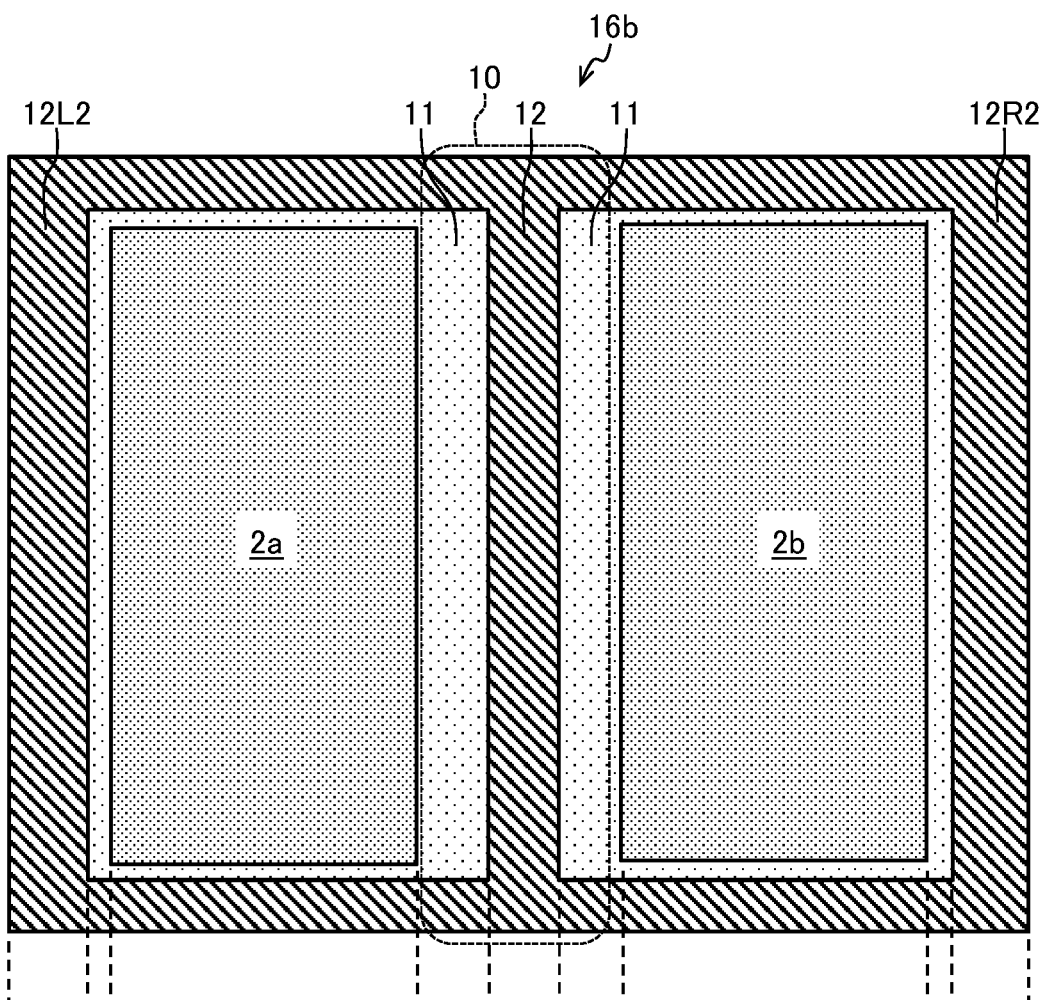
FIGS. 16A and 16B are respectively a plan view and a side view which show an example in which slit processing is performed between the wiring and around the wiring films by the dicing blade.
Figure 16B:
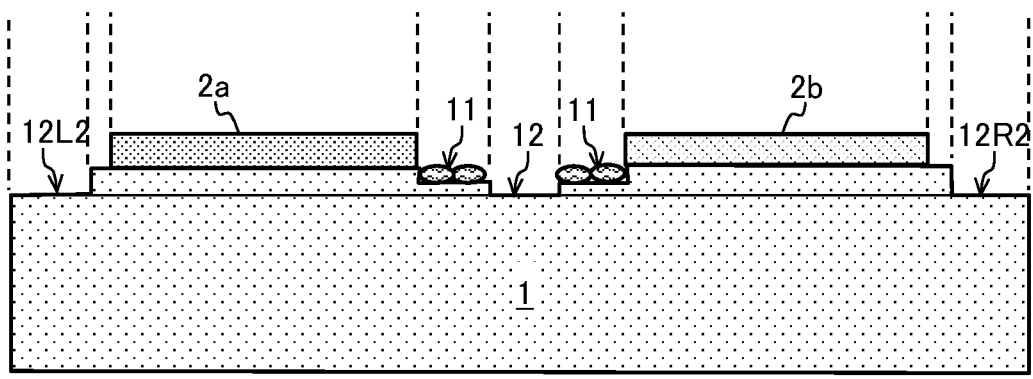

FIGS. 16A and 16B are respectively a plan view and a side view which show an example in which slit processing is performed between the wiring and around the wiring films 2a, 2b by the dicing blade.

On a substrate 16b, the rectangular wiring film 2a (first wiring film) and the rectangular wiring film 2b (second wiring film) are formed on the surface side of the single crystal silicon carbide substrate 1. Between the wiring films 2a, 2b, the gap 10 is formed in a longitudinal direction to include the opposing portions between the wiring films 2a, 2b, and the substrate surface 11 is exposed. The gap 10 (first gap) is formed continuously without being broken between the wiring films 2a, 2b from the upper end (first end portion) to the lower end (second end portion) of the surface of the substrate 16b. The substrate surface 11 is exposed at a predetermined width on each side other than the opposite portion between the wiring films 2a, 2b.

In the gap 10, the insulating portion 12 that exposes surface texture of the single crystal silicon carbide substrate 1 is formed in a linear shape to include the opposite portion between the wiring films 2a, 2b. The insulating portion 12 (first insulating portion) is a portion that, on the substrate surface 11, exposes surface texture of the single crystal silicon carbide substrate 1 and is formed continuously without being broken from the upper end (first end portion) to the lower end (second end portion) of the surface of the substrate 16b. Accordingly, the surface contaminated layer formed on the substrate surface 11 can be removed, and the insulation characteristic between the wiring films 2a, 2b can be ensured.

Further, an insulating portion 12L2 (second insulating portion) that exposes surface texture of the single crystal silicon carbide substrate 1 is respectively formed on an upper side, a lower sider and a left side of the substrate surface 11 that surrounds the wiring film 2a. An insulating portion 12R2 (second insulating portion) that exposes surface texture of the single crystal silicon carbide substrate 1 is respectively formed on an upper side, a lower sider and a right side of the substrate surface 11 that surrounds the wiring film 2b.

The insulating portions 12, 12L2 and 12R2 are mechanically formed by slitting processing with the dicing blade. Grooves of about 30 μm in the depth direction with respect to the substrate surface 11 are formed on the insulating portions 12, 12L2 and 12R2.

Accordingly, the surface contaminated layer formed on the substrate surface 11 can be removed, and the insulation characteristic between the wiring films 2a, 2b can be ensured. Further, the insulation characteristic between the wiring films 2a, 2b and the ground or the like can be ensured even when the upper side, the lower side, the left side, and the right side of the substrate 16b are in contact with the ground or the like.

Figure 17A:
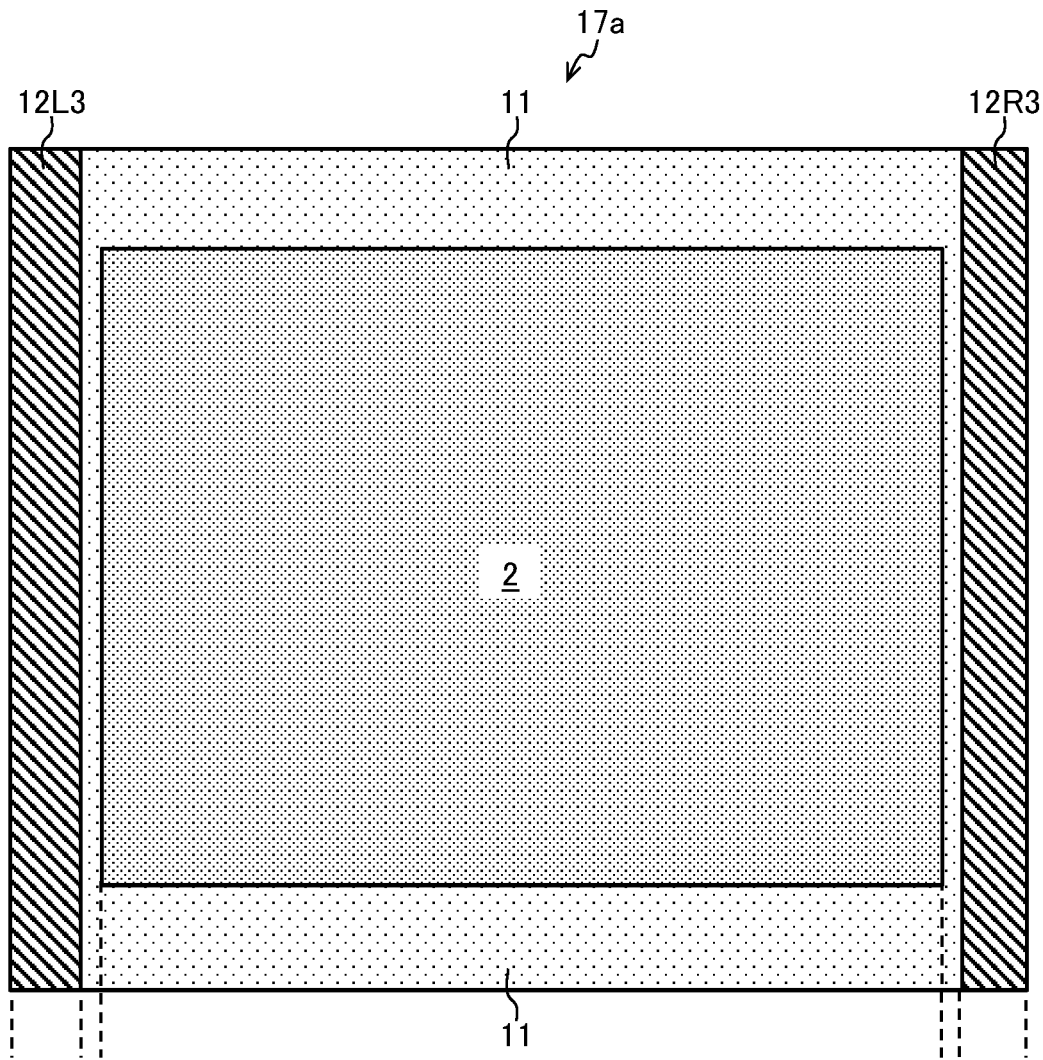
FIGS. 17A and 17B are respectively a plan view and a side view which show an example in which slit processing is performed around the wiring film by the dicing blade.
Figure 17B:
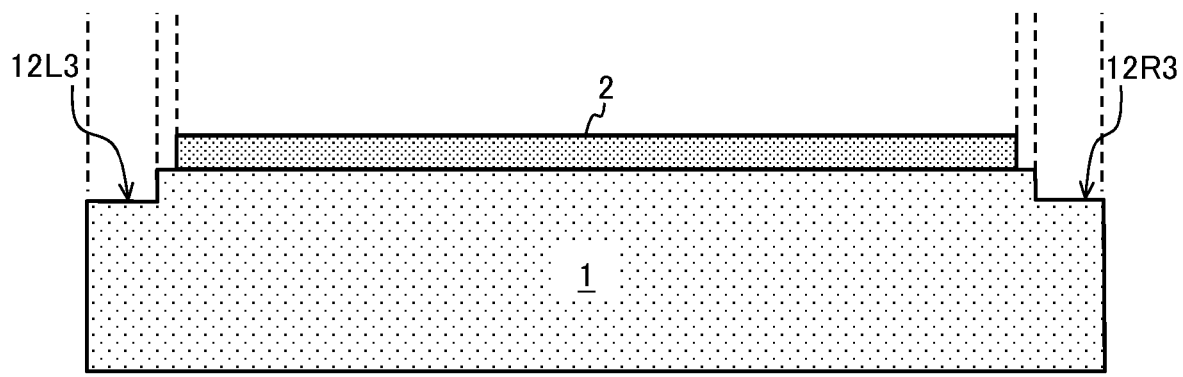

FIGS. 17A and 17B are respectively a plan view and a side view which show an example in which slit processing is performed around the wiring films 2 by the dicing blade 4 (see FIGS. 19A and 19B).

On a substrate 17a, the rectangular wiring film 2 is formed on the surface side of the single crystal silicon carbide substrate 1. The substrate surface 11 is exposed on each of the four sides of the wiring film 2. An insulating portion 12L3 (second insulating portion) that exposes surface texture of the single crystal silicon carbide substrate 1 is formed in a linear shape on a left side of the substrate surface 11 surrounding the wiring film 2. An insulating portion 12R3 (second insulating portion) that exposes surface texture of the single crystal silicon carbide substrate 1 is formed in a linear shape on a right side of the substrate surface 11 surrounding the wiring film 2. The insulating portions 12L3, 12R3 are mechanically formed by processing with the dicing blade 4 (see FIGS. 19A and 19B). Grooves of about 30 μm in the depth direction with respect to the substrate surface 11 are formed on the insulating portions 12L3, 12R3.

Accordingly, the insulation characteristic between the wiring film 2 and the ground or the like can be ensured even when the left side and the right side of the substrate 17a are in contact with the ground or the like.

Figure 18A:
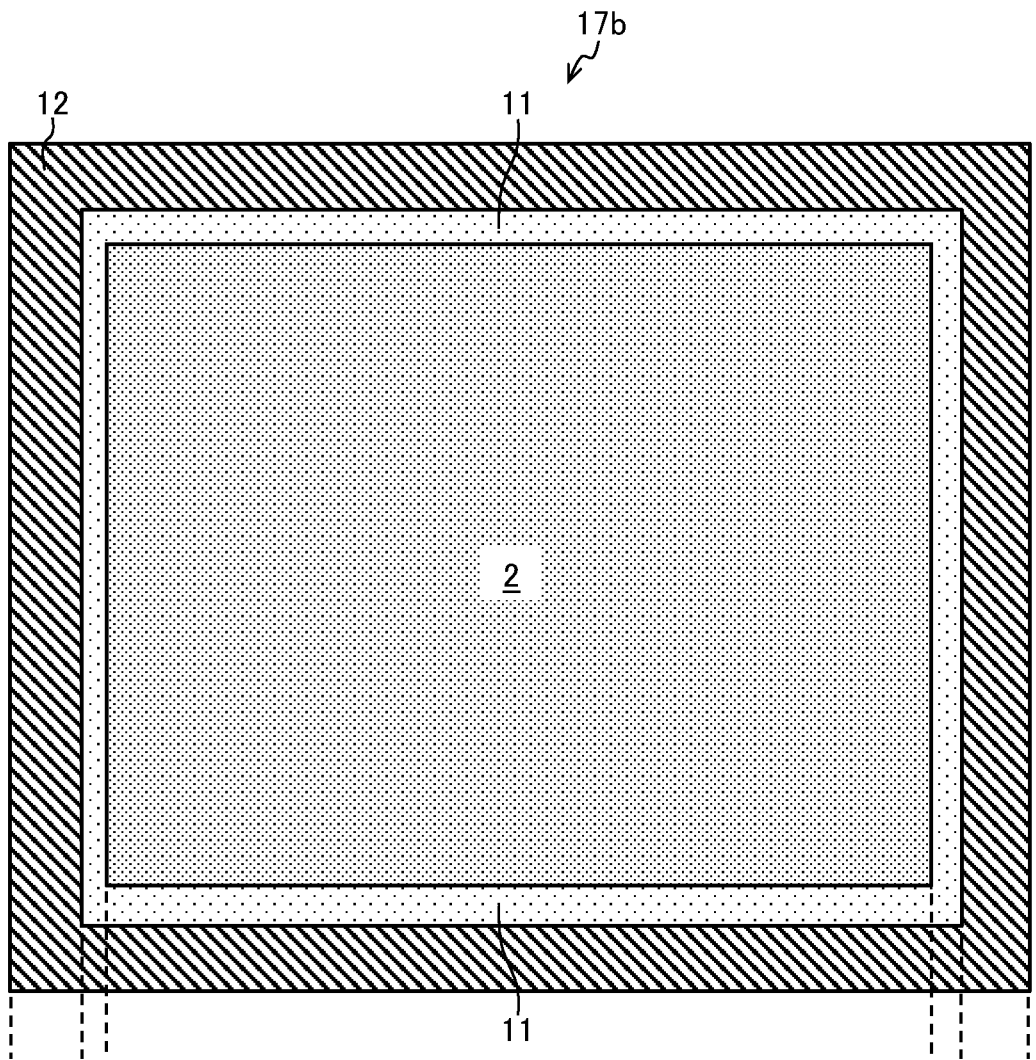
FIGS. 18A and 18B are respectively a plan view and a side view which show an example in which slit processing is performed around the wiring film by the dicing blade.
Figure 18B:
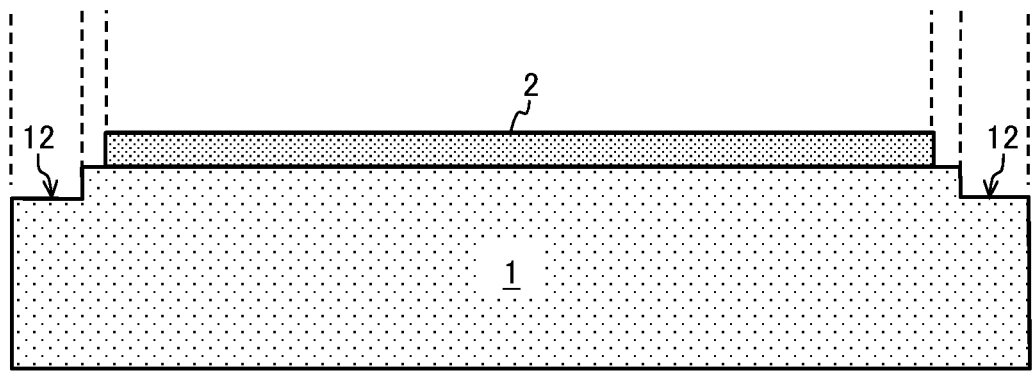

FIGS. 18A and 28B are respectively a plan view and a side view which show an example in which slit processing is performed around the wiring film 2 by the dicing blade.

On a substrate 17b, the rectangular wiring film 2 is formed on the surface side of the single crystal silicon carbide substrate 1. The substrate surface 11 is exposed on each of the four sides of the wiring film 2. An insulating portion 12 that exposes surface texture of the single crystal silicon carbide substrate 1 is formed on each of the four sides of the substrate surface 11 that surrounds the wiring film 2. The insulating portion 12 is mechanically formed by slitting processing with the dicing blade. A groove of about 30 μm in the depth direction with respect to the substrate surface 11 is formed on the insulating portion 12.

Accordingly, the insulation characteristic between the wiring film 2 and the ground or the like can be ensured even when the upper side, the lower side, the left side and the right side of the substrate 17b are in contact with the ground or the like.

FIGS. 19A and 19B are respectively a side view and a plan view which show an example of a shape of the dicing blade 4.

The dicing blade 4 has a disk shape, has a thickness of 30 μm to 200 μm, and end portions become thinner gradually. The dicing blade 4 is mounted on a dicing saw (not shown) and brought into contact with the single crystal silicon carbide substrate 1 when, for example, being rotated in a clockwise direction to form a groove having a depth of about 30 μm on the single crystal silicon carbide substrate 1.

Figure 20A:
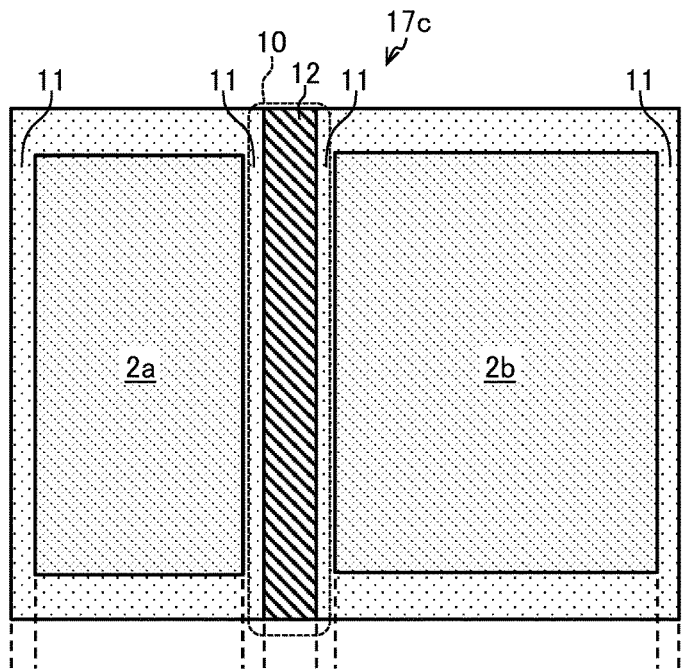
FIGS. 20A, 20B, and 20C are respectively a plan view, a side view, and a back side view which show a substrate in a case where grooving processing is performed between the first wiring film and the second wiring film on the surface and grooving processing is performed on four sides of a wiring film on a back surface.
Figure 20B:
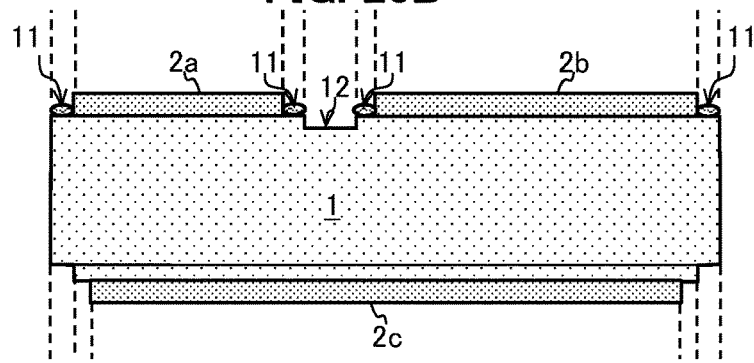
Figure 20C:
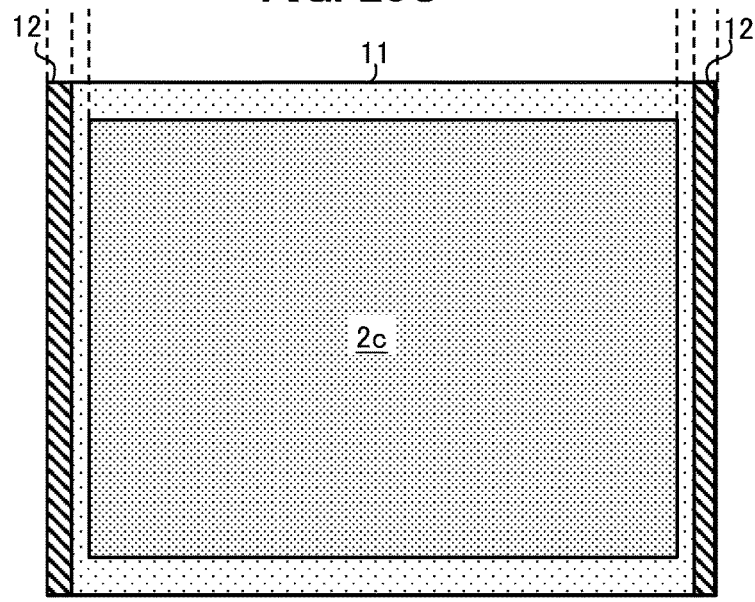

FIGS. 20A, 20B, and 20C are views showing a substrate 17c in a case where grooving processing is performed between the first wiring film 2a and the second wiring film 2b on the surface and grooving processing is performed on two sides of a wiring film 2c on a back surface. FIGS. 20A, 20B, and 20C show respectively a plan view, a side view and a back side view at the same time.

On the substrate 17c, the rectangular wiring film 2a (first wiring film) and the rectangular wiring film 2b (second wiring film) are formed on the surface side of the single crystal silicon carbide substrate 1. Between the wiring films 2a, 2b, the gap 10 is formed in a longitudinal direction to include the opposite portion between the wiring films 2a, 2b, and the substrate surface 11 is exposed. The gap 10 (first gap) is formed continuously without being broken between the wiring films 2a, 2b from the upper end (first end portion) to the lower end (second end portion) of the surface of the substrate 17c. The substrate surface 11 is exposed at a predetermined width on each side other than the opposite portion between the wiring films 2a, 2b.

In the gap 10, the insulating portion 12 that exposes surface texture of the single crystal silicon carbide substrate 1 is formed in a linear shape to include the opposite portion between the wiring films 2a, 2b. The insulating portion 12 (first end portion) is a portion that, on the substrate surface 11, exposes surface texture of the single crystal silicon carbide substrate 1 and is formed without being broken from the upper end (first end portion) to the lower end (second end portion) of the surface of the substrate 17c.

The insulating portion 12 is mechanically formed by processing with the dicing blade 4 (see FIGS. 19A and 19B). A groove of about 30 μm in the depth direction with respect to the substrate surface 11 is formed on the insulating portion 12. Accordingly, the surface contaminated layer formed on the substrate surface 11 can be removed, and the insulation characteristic between the wiring films 2a, 2b can be ensured.

On the substrate 17c, the rectangular wiring film 2c is formed on a back surface side of the single crystal silicon carbide substrate 1. The substrate surface 11 is exposed at a predetermined width at four sides of the wiring film 2c. The insulating portion 12 that exposes surface texture of the single crystal silicon carbide substrate 1 is formed in a linear shape and at a predetermined width on the left side and the right side of the substrate surface 11 surrounding the wiring film 2c.

On the back surface of the substrate 17c, four sides of an outer periphery of the wiring film 2c are cut off to prevent burrs at the time of cutting. Thereafter, grooving processing is performed on the back surface of the substrate 17c by the dicing blade 4 (see FIGS. 19A and 19B). At this time, the wiring film 2c is pulled back so as not to be cut. Accordingly, the surface contaminated layer formed on the substrate back surface can be removed, and the insulation characteristic between the wiring film 2c and the ground can be ensured even when any one of the left side and the right side of the substrate 17c is brought near the ground.

Figure 21A:
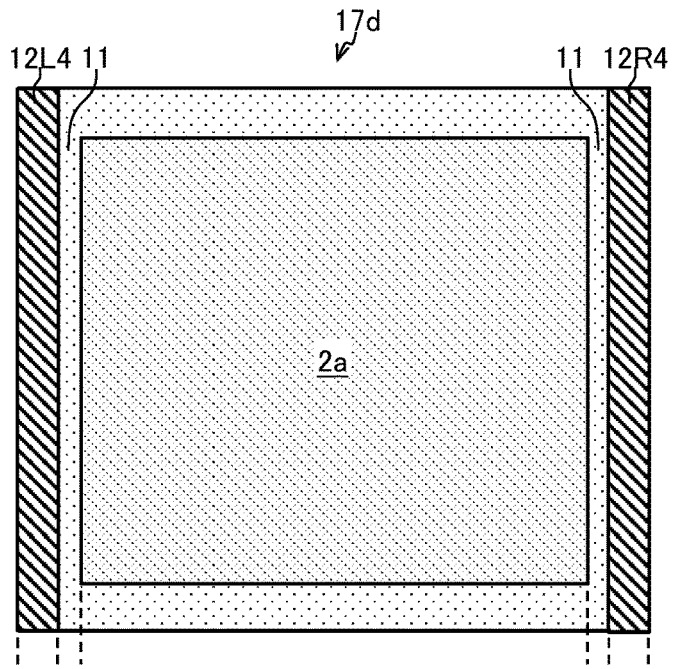
FIGS. 21A, 21B, and 21C are respectively a plan view, a side view, and a back side view which show a substrate in a case where the wiring film is provided on the surface and grooving processing is performed on the four sides of the wiring film on the back surface.
Figure 21B:
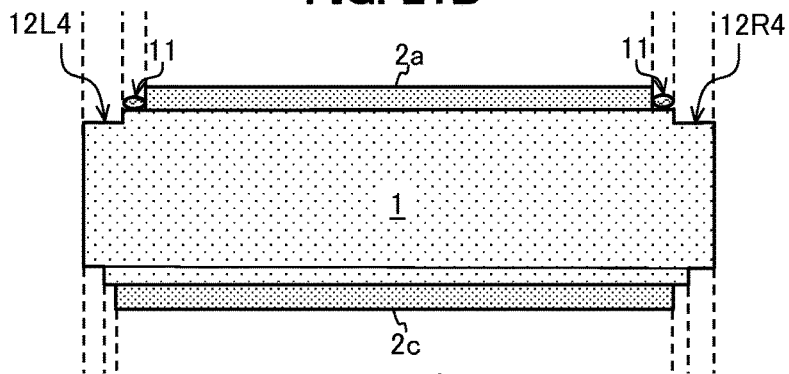
Figure 21C:
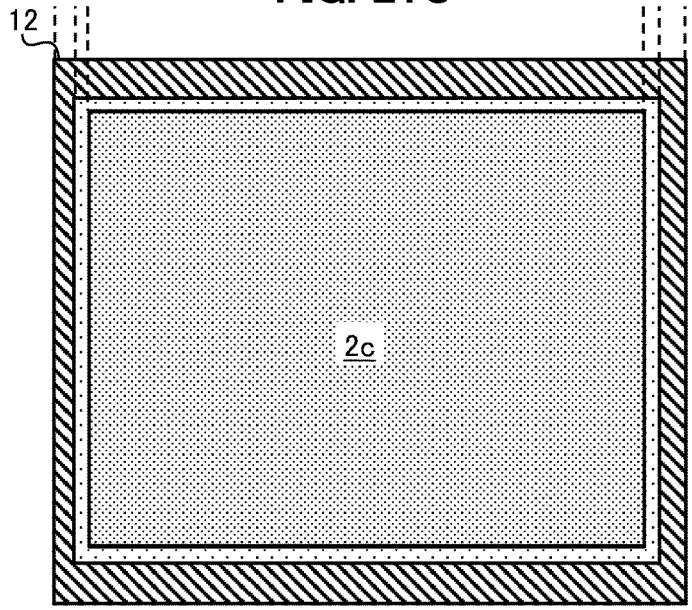

FIGS. 21A, 21B, and 21C are views showing a substrate 17d in a case where grooving processing is performed on the left side and the right side of the wiring film 2a on the surface and grooving processing is performed at four sides of the wiring film 2c on the back surface. FIGS. 21A, 21B, and 21C show respectively a top view, a side view, and a bottom view at the same time.

On the substrate 17d, the rectangular wiring film 2a is formed on the surface side of the single crystal silicon carbide substrate 1. The substrate surface 11 is exposed at a predetermined width at four sides around the wiring film 2a. Further, an insulating portion 12L4 (second insulating portion) that exposes surface texture of the single crystal silicon carbide substrate 1 is formed in a linear shape on the left side of the substrate surface 11. The insulating portion 12L4 is a portion that, on the substrate surface 11, exposes surface texture of the single crystal silicon carbide substrate 1 and is formed continuously without being broken from the upper end (first end portion) to the lower end (second end portion) of the surface of the substrate 17d.

An insulating portion 12R4 (second insulating portion) that exposes surface texture of the single crystal silicon carbide substrate 1 is formed in a linear shape on the right side of the substrate surface 11. The insulating portion 12R4 is a portion that, on the substrate surface 11, exposes surface texture of the single crystal silicon carbide substrate 1 and is formed continuously without being broken from the upper end (first end portion) to the lower end (second end portion) of the surface of the substrate 17d.

The insulating portions 12L4, 12R4 are mechanically formed by processing with the dicing blade 4 (see FIGS. 19A and 19B). Groove of about 30 μm in the depth direction with respect to the substrate surface 11 are formed on the insulating portions 12L4, 12R4.

Accordingly, the surface contaminated layer formed on the substrate surface 11 can be removed, and the insulation characteristic between the wiring film 2a and the ground can be ensured even when the left side and the right side of the substrate 17d are brought near the ground.

On a substrate 17d, the rectangular wiring film 2c is formed on the back surface side of the single crystal silicon carbide substrate 1. The insulating portion 12 that exposes surface texture of the single crystal silicon carbide substrate 1 is formed at a predetermined width on four sides of the wiring film 2c.

On the back surface of the substrate 17d, the four sides of the outer periphery of the wiring film 2c are first cut off to prevent burrs at the time of cutting. Thereafter, grooving processing is performed on the back surface of the substrate 17d. At this time, the wiring film 2d is pulled back so as not to be cut. Accordingly, the surface contaminated layer formed on the substrate back surface can be removed, and the insulation characteristic between the wiring film 2c and the ground can be ensured even when any one of the left side and the right side of the substrate 17d is brought near the ground.

Hereinafter, a case where a single crystal silicon carbide substrate with a thermal conductivity of about 490 W/m·K is used as a semiconductor laser substrate will be described in FIGS. 22 to 26.

Semiconductor Laser in First Embodiment

Figure 22:
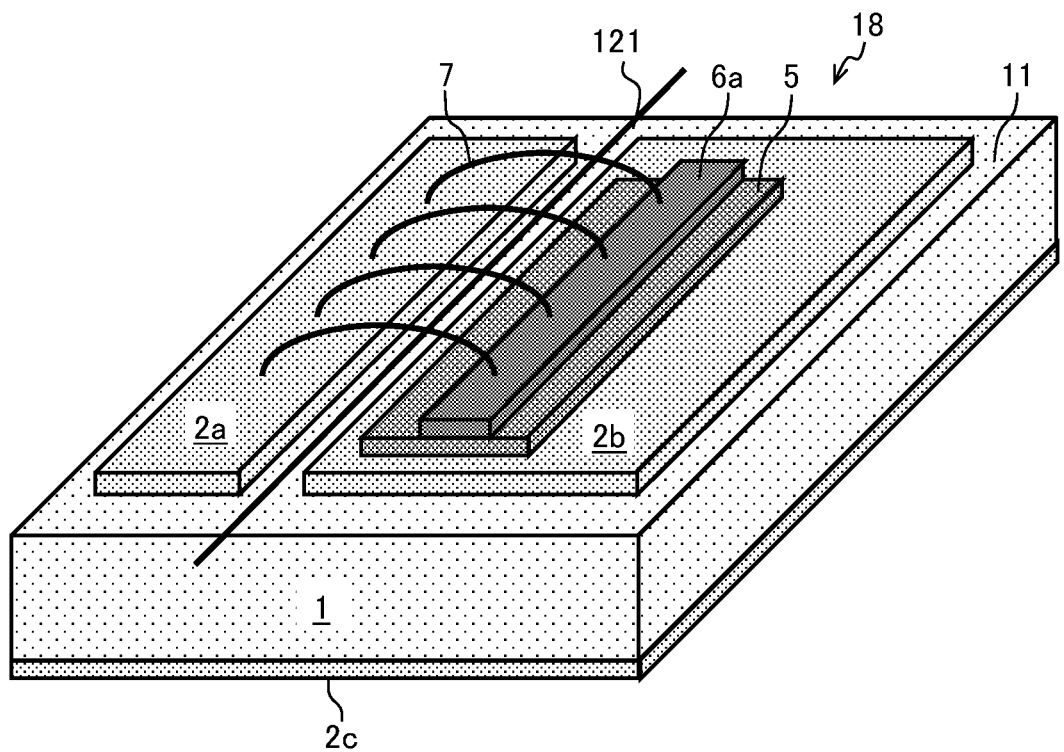
FIG. 22 is a perspective view showing a semiconductor laser before grooving processing (before operation)

FIG. 22 is a perspective view showing a semiconductor laser 18 before grooving processing.

The semiconductor laser 18 includes the single crystal silicon carbide substrate 1, the wiring film 2c formed on the back surface, the wiring films 2a, 2b formed on the surface, a thin film solder 5 on the wiring film 2b, and a semiconductor laser element 6a on the thin film solder 5. Between the wiring films 2a, 2b, a gap is formed to include the opposite portion between the wiring films 2a, 2b, and the substrate surface 11 is exposed. The substrate surface 11 (first gap) is formed continuously without being broken between the wiring films 2a, 2b from the upper end (first end portion) to the lower end (second end portion) of the surface.

A gold wire 7 is wired between the semiconductor laser element 6a and the wiring film 2a. Since the semiconductor laser element 6a is disposed on the single crystal silicon carbide substrate 1 with a thermal conductivity of about 490

W/m·K, the semiconductor laser is good in heat dissipation and is suitable for high frequency operations and continuous operations.

The surface contaminated layer is formed on the substrate surface 11 of the single crystal silicon carbide substrate 1 by dry etching. Thus, the insulation characteristic between the wiring films 2a, 2b is impaired. Therefore, the surface contaminated layer is removed by machining or laser processing along a grooving processing position 121.

Figure 23:
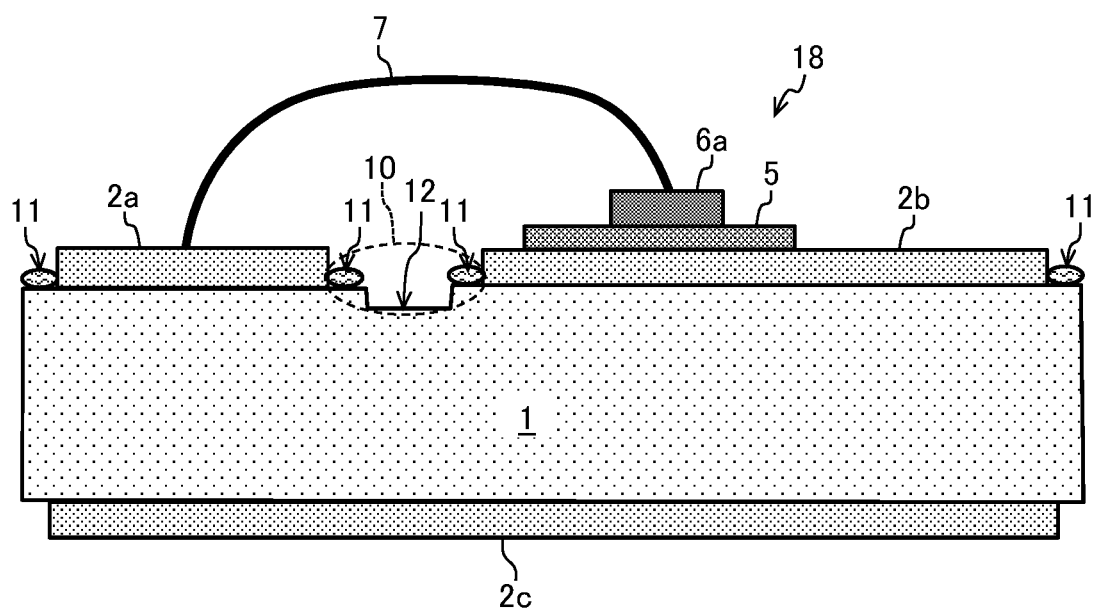
FIG. 23 is a side view showing the semiconductor laser after the grooving processing (after operation)

FIG. 23 is a side view showing the semiconductor laser 18 after grooving processing.

On the semiconductor laser 18, the gap 10 (first gap) is formed continuously without being broken between the wiring films 2a, 2b from the upper end (first end portion) to the lower end (second end portion) of the surface. Further, on the semiconductor laser 18, the insulating portion 12 that exposes surface texture of the single crystal silicon carbide substrate 1 is formed in the gap 10. The insulating portion 12 (first end portion) is a portion that, on the substrate surface 11, exposes surface texture of the single crystal silicon carbide substrate 1 and is formed continuously without being broken from the upper end (first end portion) to the lower end (second end portion) of the surface of the substrate 15a. The insulating portion 12 is mechanically formed by laser processing, blasting processing or processing with the dicing blade 4 (see FIGS. 19A and 19B). A groove of about 30 μm in the depth direction with respect to the substrate surface 11 is formed on the insulating portion 12. Accordingly, the surface contaminated layer formed on the substrate surface 11 can be removed, and the insulation characteristic between the wiring films 2a, 2b can be ensured.

Semiconductor Laser in Second Embodiment

The second embodiment shows an example in which a first semiconductor laser and a second semiconductor laser with different wavelengths are packaged into one.

Figure 24:
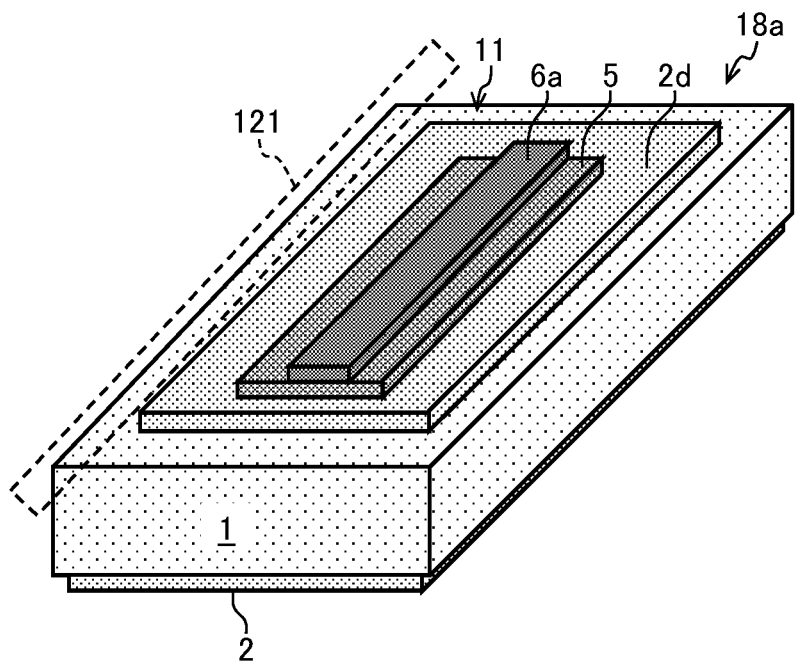
FIG. 24 is a perspective view showing a processing example of a first semiconductor laser.

FIG. 24 is a perspective view showing a processing example of a first semiconductor laser 18a.

The semiconductor laser 18a (first semiconductor laser) is applied to an optical pickup of, for example, a compact disc or a digital versatile disc, and includes the single crystal silicon carbide substrate 1, the wiring film 2c formed on the back surface, a wiring film 2d formed on the surface, the thin film solder 5 on the wiring film 2d, and the semiconductor laser element 6a on the thin film solder 5. Since the semiconductor laser element 6a is disposed on the single crystal silicon carbide substrate 1 with a thermal conductivity of about 490 W/m·K, the semiconductor laser is good in heat dissipation and is suitable for high frequency operations and continuous operations.

A surface contaminated layer is formed on the substrate surface 11 of the single crystal silicon carbide substrate 1 by dry etching. Thus, the insulation characteristic on the substrate surface 11 is impaired. Therefore, the surface contaminated layer is removed by performing grooving by machining or laser processing along the grooving processing position 121.

Figure 25:
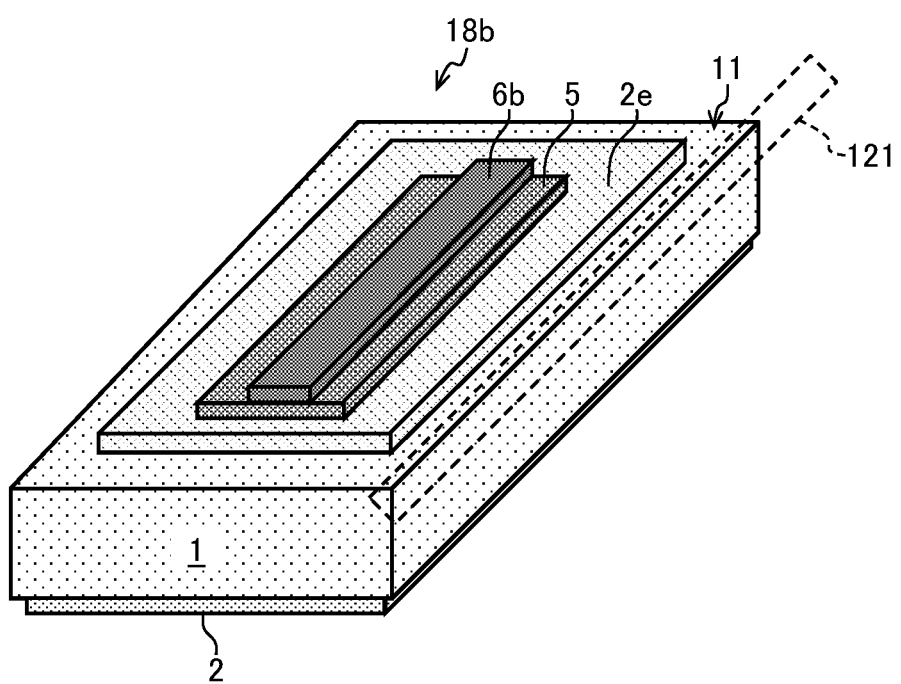
FIG. 25 is a perspective view showing a processing example of a second semiconductor laser.

FIG. 25 is a perspective view showing a processing example of a second semiconductor laser 18b.

The semiconductor laser 18b (second semiconductor laser) is applied to an optical pickup of, for example, a Blu-ray disc (registered trademark), and includes the single crystal silicon carbide substrate 1, the wiring film 2c formed on the back surface, a wiring film 2e formed on the surface, the thin film solder 5 on the wiring film 2e, and a semiconductor laser element 6b on the thin film solder 5. The semiconductor laser element 6b oscillates at a wavelength different from that of the semiconductor laser element 6a. Since the semiconductor laser element 6b is disposed on the single crystal silicon carbide substrate 1 with a thermal conductivity of about 490 W/m·K, the semiconductor laser is good in heat dissipation and is suitable for high frequency operations and continuous operations.

A surface contaminated layer is formed on the substrate surface 11 of the single crystal silicon carbide substrate 1 by dry etching. Thus, the insulation characteristic on the substrate surface 11 is impaired. Therefore, the surface contaminated layer is removed by performing grooving by machining or laser processing along the grooving processing position 121.

Figure 26:
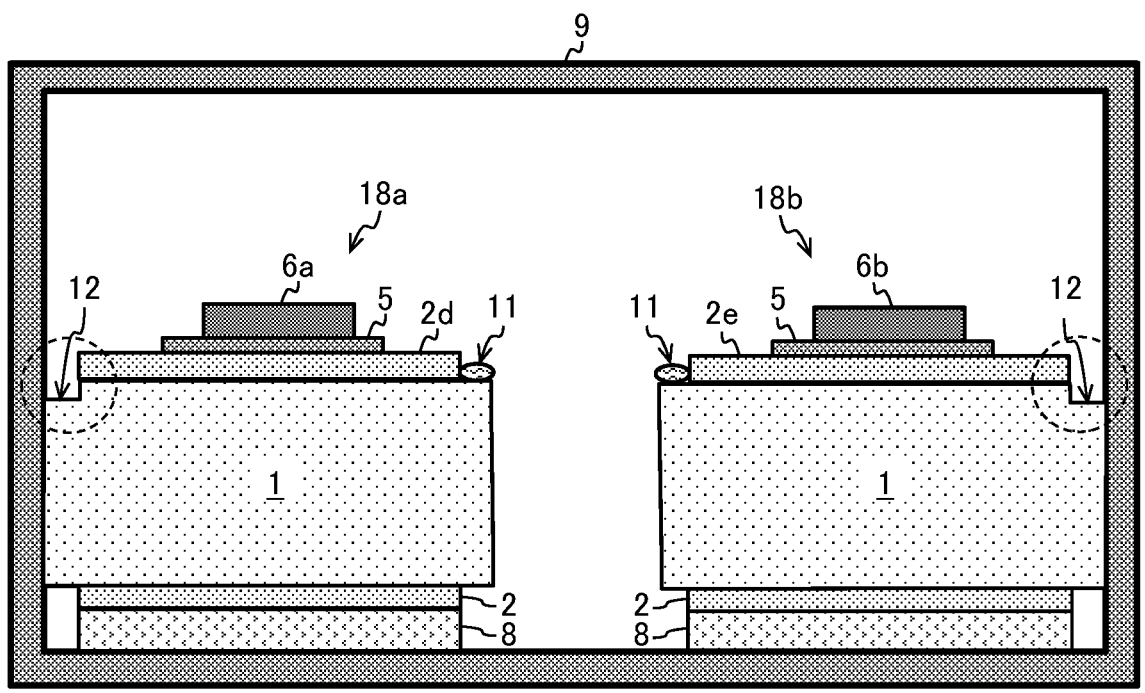
FIG. 26 is a view showing an example in which the first and second semiconductor lasers are packaged into one.

FIG. 26 is a view showing an example in which the first semiconductor laser and the second semiconductor laser are packaged into one.

Inside a package 9, the semiconductor laser 18a and the semiconductor laser 18b are disposed on other members 8. The semiconductor laser 18a is disposed on a left side of the package 9. The semiconductor laser 18b is disposed on a right side of the package 9.

The package 9 is made of metal and is connected to the ground (not shown). At this time, on the substrate surface 11 of the semiconductor laser 18a, the insulating portion 12 that exposes surface texture of the single crystal silicon carbide substrate 1 is formed in a linear shape on a portion in contact with the package 9. Accordingly, the insulation characteristic between the package 9 and the wiring film 2d is ensured.

Similarly, on the substrate surface 11 of the semiconductor laser 18b, the insulating portion 12 that exposes surface texture of the single crystal silicon carbide substrate 1 is formed in a linear shape on a portion in contact with the package 9. Accordingly, the insulation characteristic between the package 9 and the wiring film 2e is ensured.

(Modification)

The present invention is not limited to the embodiments described above and includes various modifications. For example, the embodiments described above have been described in detail for easy understanding of the present invention, and the present invention is not necessarily limited to those including all the configurations described above. A part of the configuration of one embodiment can be replaced with the configuration of another embodiment, and the configuration of another embodiment can also be added to the configuration of one embodiment. Other configurations may be added to, deleted from or replaced with a part of a configuration of each embodiment.

Modifications of the present invention include, for example, the following (a) to (c).

(a) The method of forming the insulating portion may be any one of machining, blasting processing, and laser processing by the dicing blade.

(b) Between the wiring films 2a, 2b, the gap is formed continuously without being broken from the first end portion to the second end portion, and on the substrate, the insulating portion that exposes surface texture of the single crystal silicon carbide substrate is formed continuously without being broken from the first end portion to the second end portion in the gap. Further, the insulating portion that exposes surface texture of the single crystal silicon carbide substrate may be formed continuously without being broken around the wiring films 2a, 2b.

(c) The gap or the insulating portion is not limited to a continuous form without being broken from the upper end to the lower end. Instead of from the upper end to the lower end, the gap or the insulating portion may be formed continuously without being broken from any one of the following: from the left end to the right end, from the left end to the upper end, from the left end to the lower end, from the right end to the upper end, from the right end to the lower end.

Although the invention has been described above by reference to certain embodiments of the invention, the invention is not limited to the embodiments described above. Modifications and variations of the embodiments described above will occur to those skilled in the art, in light of the above teachings. The scope of the invention is defined with reference to the following claims.

What is claimed is:

1. A single crystal silicon carbide substrate comprising:
a substrate of a single crystal silicon carbide;
a first wiring film and a second wiring film disposed on one side of the substrate and having therebetween an interstice which is formed continuously in a straight line without being broken from a first end of the one side to a second end of the one side, wherein the first end and the second end are at opposite ends of the substrate; and
an insulating portion disposed in the interstice between the first wiring film and the second wiring film and including a surface texture of the one side exposed by removing using dry etching a surface contaminated layer which is contaminated by at least one of iron, aluminum, chromium, or nickel adhered thereto.

2. A semiconductor laser comprising:
the single crystal silicon carbide substrate according to claim 1; and
a semiconductor element configured on the single crystal silicon carbide substrate.

3. A single crystal silicon carbide substrate comprising:
a substrate of a single crystal silicon carbide;
a wiring film disposed on one side of the substrate, a surface of the substrate being continuous without being broken and exposed around the wiring film; and
an insulating portion disposed around the exposed surface of the substrate at a level below the exposed surface of the substrate and including a surface texture of the one side of the substrate exposed by removing using dry etching a surface contaminated layer which is contaminated by at least one of iron, aluminum, chromium, or nickel adhered thereto.

4. A semiconductor laser comprising:
the single crystal silicon carbide substrate according to claim 3; and
a semiconductor element configured on the single crystal silicon carbide substrate.

5. A method for manufacturing a single crystal silicon carbide substrate, comprising:
forming a wiring film on a whole surface of one side of a substrate of a single crystal silicon carbide;
forming on a part of an upper layer of the wiring film a first photoresist layer and a second photoresist layer with an interstice therebetween using a patterning;
removing a non-patterning region of the wiring film other than the first photoresist layer and the second photoresist layer by a dry etching;
exposing a first wiring film and a second wiring film by removing the first photoresist layer and the second photoresist layer; and
forming a first insulating portion by removing a part or a whole of a surface of the substrate in the interstice and exposing a surface texture of the one side of the substrate continuously in a straight line without being broken with a width from a first end of the one side to a second end of the one side, wherein the first end and the second end are at opposite ends of the substrate.

6. The method according to claim 5 further comprising:
forming on the one side of the substrate a second insulating portion by removing a part or a whole of a surface of the substrate around the first wiring film and the second wiring film other than sides of the substrate intersecting with the interstice, being joined with the first insulating portion, and exposing a surface texture of the one side of the substrate continuously without being broken.

7. A method for manufacturing a single crystal silicon carbide substrate, comprising:
forming a wiring film on a whole surface of one side of a substrate of a single crystal silicon carbide;
forming a photoresist layer on a part of an upper layer of the wiring film by a patterning;
removing a non-patterning region of the wiring film other than the photoresist layer by a dry etching;
removing the photoresist layer from the wiring film;
forming an insulating portion, which is exposed around the wiring film and disposed further around an exposed surface of the substrate, continuously without being broken by removing a part or a whole of a surface of the substrate and exposing a surface texture of the one side of the substrate, wherein the insulating portion is formed at a level below the exposed surface of the substrate.

* * * * *